(12) United States Patent
Yoneda et al.

(10) Patent No.: US 8,873,598 B2
(45) Date of Patent: Oct. 28, 2014

(54) WAVEGUIDE-TYPE OPTICAL SEMICONDUCTOR DEVICE

(71) Applicant: Sumitomo Electric Industries, Ltd., Osaka (JP)

(72) Inventors: Yoshihiro Yoneda, Isehara (JP); Hirohiko Kobayashi, Machida (JP); Ryuji Masuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 102 days.

(21) Appl. No.: 13/741,660

(22) Filed: Jan. 15, 2013

(65) Prior Publication Data

US 2013/0182733 A1    Jul. 18, 2013

(30) Foreign Application Priority Data

Jan. 18, 2012  (JP) ................................ 2012-008295

(51) Int. Cl.
| | | |
|---|---|---|
| H01S 5/00 | (2006.01) | |
| H01S 5/22 | (2006.01) | |
| H01S 5/227 | (2006.01) | |
| H01S 5/343 | (2006.01) | |
| H01S 5/32 | (2006.01) | |

(52) U.S. Cl.
CPC ............. *H01S 5/22* (2013.01); *H01S 2301/176* (2013.01); *H01S 5/34306* (2013.01); *H01S 5/2275* (2013.01); *H01S 5/2214* (2013.01); *H01S 5/3201* (2013.01); *H01S 5/2213* (2013.01)

USPC ........................................................ 372/44.01

(58) Field of Classification Search
CPC ........ H01S 5/22; H01S 5/2214; H01S 5/2275
USPC .............................. 372/44.01, 45.012, 46.012
See application file for complete search history.

(56) References Cited

U.S. PATENT DOCUMENTS

| | | | | |
|---|---|---|---|---|
| 2004/0028875 | A1* | 2/2004 | Van Rijn et al. ................. | 428/98 |
| 2011/0075693 | A1* | 3/2011 | Kuramochi et al. ........ | 372/44.01 |

FOREIGN PATENT DOCUMENTS

JP         8-220358        8/1996

\* cited by examiner

*Primary Examiner* — Tuan Nguyen
(74) *Attorney, Agent, or Firm* — Smith, Gambrell & Russell LLP

(57) ABSTRACT

A waveguide-type optical semiconductor device includes a substrate with a main surface; a structure including a stacked semiconductor layer including a core layer provided on the main surface of the substrate, a stripe-shaped mesa portion protruding in a first direction orthogonal to the main surface and extending in a second direction parallel to the main surface, and a pair of stripe-shaped grooves defining the stripe-shaped mesa portion and extending in the second direction; a protrusion provided in the pair of stripe-shaped grooves, the protrusion protruding from the structure in the first direction; and a resin portion covering a side face of the protrusion, the resin portion being buried in the stripe-shaped grooves. The relative position of the protrusion with respect to the structure is fixed. In addition, the side face of the protrusion intersects with the second direction when viewed from the first direction.

8 Claims, 19 Drawing Sheets

WAVEGUIDE-TYPE OPTICAL SEMICONDUCTOR DEVICE

BACKGROUND OF THE INVENTION

1. Field of the Invention

The present invention relates to a waveguide-type optical semiconductor device.

2. Description of the Related Art

Japanese Unexamined Patent Application Publication No. 8-220358 discloses a waveguide-type optical semiconductor device provided with a ridge waveguide. In this document, grooves (stripe-shaped grooves) are formed by etching to form ridge portions on both sides of the ridge waveguide. The etched grooves are filled with a material other than a semiconductor material for planarization. In addition, the width of each of the etched grooves is designed to an optimal value. As a result, the high-power performance and reliability of the optical semiconductor device can be improved.

SUMMARY OF THE INVENTION

A waveguide-type optical semiconductor device including, for example, a ridge waveguide typically includes a stripe-shaped mesa portion. In the case of producing the mesa portion of the optical semiconductor device, typically, a stacked semiconductor layer including a core layer and so forth is grown. A pair of stripe-shaped grooves are formed in the stacked semiconductor layer to form the mesa portion. After the formation of the mesa portion, an electrode and an electrical interconnection are formed on the stacked semiconductor layer. When the electrode and the electrical interconnection partially located in the stripe-shaped grooves are formed, an optical loss due to the scattering and absorption of light propagating through the waveguide is disadvantageously increased. To avoid the problems, after the formation of the mesa portion, the pair of stripe-shaped grooves are filled with a resin to planarize a surface. Then the electrode and the electrical connection may be formed on the stacked semiconductor layer and the resin portions.

However, the stacked semiconductor layer and the resin differ significantly in thermal expansion coefficient. Thus, stresses are generated in the cured resin portions buried in the stripe-shaped grooves. This causes problems of the detachment of the resin portions from the stacked semiconductor layer during the curing of the resin, a step subsequent to the completion of the curing of the resin (e.g., the formation of an upper electrode and the cleavage of a substrate to form facets of the waveguide), and the use of the optical semiconductor device.

A waveguide-type optical semiconductor device according to the present invention includes a substrate with a main surface; a structure including a stacked semiconductor layer including a core layer provided on the main surface of the substrate, a stripe-shaped mesa portion protruding in a first direction orthogonal to the main surface and extending in a second direction parallel to the main surface, and a pair of stripe-shaped grooves defining the stripe-shaped mesa portion and extending in the second direction; a protrusion portion provided in the pair of stripe-shaped grooves, the protrusion portion including at least one protrusion, the protrusion protruding from the structure in the first direction; and a resin portion covering a side face of the protrusion, the resin portion being buried in the stripe-shaped grooves. The relative position of the protrusion with respect to the structure is fixed. In addition, the side face of the protrusion intersects with the second direction when viewed from the first direction.

In the waveguide-type optical semiconductor device according to the present invention, the protrusion portion including at least one protrusion is provided in the pair of stripe-shaped grooves, thereby resulting in a reduction in the volume of the resin portion buried in the stripe-shaped grooves and thus achieving a reduction in stress generated in the resin portion. In addition, relative position of the protrusion in the protrusion portion is fixed with respect to the structure. The resin portion covers a side face of the protrusion. This results in an increase in the area of contact of the resin portion with other elements that hold the resin portion, compared with the case where such a protrusion is not present. A side face of the protrusion is provided so as to intersect with the second direction when viewed from the first direction. Thus, a stress acting in the second direction in the resin portion and a stress acting in a direction orthogonal to the second direction are distributed in directions different from the directions in which these stresses act, thereby resulting in a uniformly distributed stress in the resin portion. These effects inhibit the detachment of the resin portion from other elements.

In the waveguide-type optical semiconductor device according to an embodiment of the present invention, preferably, the protrusion portion includes a plurality of protrusions, and the plurality of protrusions are arranged in the second direction. This results in a further increase in the area of contact of the resin portion with other elements that hold the resin portion, thereby further inhibiting the detachment of the resin portion from the above-referenced other elements.

In the waveguide-type optical semiconductor device according to an embodiment of the present invention, preferably, the protrusion has a substantially columnar shape with a height in the first direction and has a substantially rhombic shape or a substantially rectangular shape when viewed from the first direction. Thus, a stress acting in the second direction in the resin portion and a stress acting in a direction orthogonal to the second direction are efficiently distributed in directions different from the directions in which these stresses act, thereby resulting in a more uniformly distributed stress in the resin portion. This further inhibits the detachment of the resin portion from other elements.

In the waveguide-type optical semiconductor device according to an embodiment of the present invention, the protrusion may have a substantially columnar shape with a height in the first direction and may have a substantially triangular shape or a substantially pentagonal shape with a side substantially orthogonal to the second direction when viewed from the first direction. The protrusion may have a substantially columnar shape with a height in the first direction and may have a substantially elliptical shape with a minor axis that extends substantially in the second direction or may have a substantially circular shape when viewed from the first direction.

In the waveguide-type optical semiconductor device according to an embodiment of the present invention, preferably, the protrusion has a width in a direction orthogonal to the second direction when viewed from the first direction, and the protrusion extends in the second direction with the width increased and decreased repeatedly. As a result, the area of contact of the resin portion with other elements that hold the resin portion further increases, thereby further inhibiting the detachment of the resin portion from the above-referenced other elements.

In the waveguide-type optical semiconductor device according to an embodiment of the present invention, preferably, the resin portion is composed of a benzocyclobutene resin or a polyimide resin. Preferably, the core layer in the stacked semiconductor layer is included in the stripe-shaped mesa portion.

DESCRIPTION OF THE PREFERRED EMBODIMENTS

Figure 1:
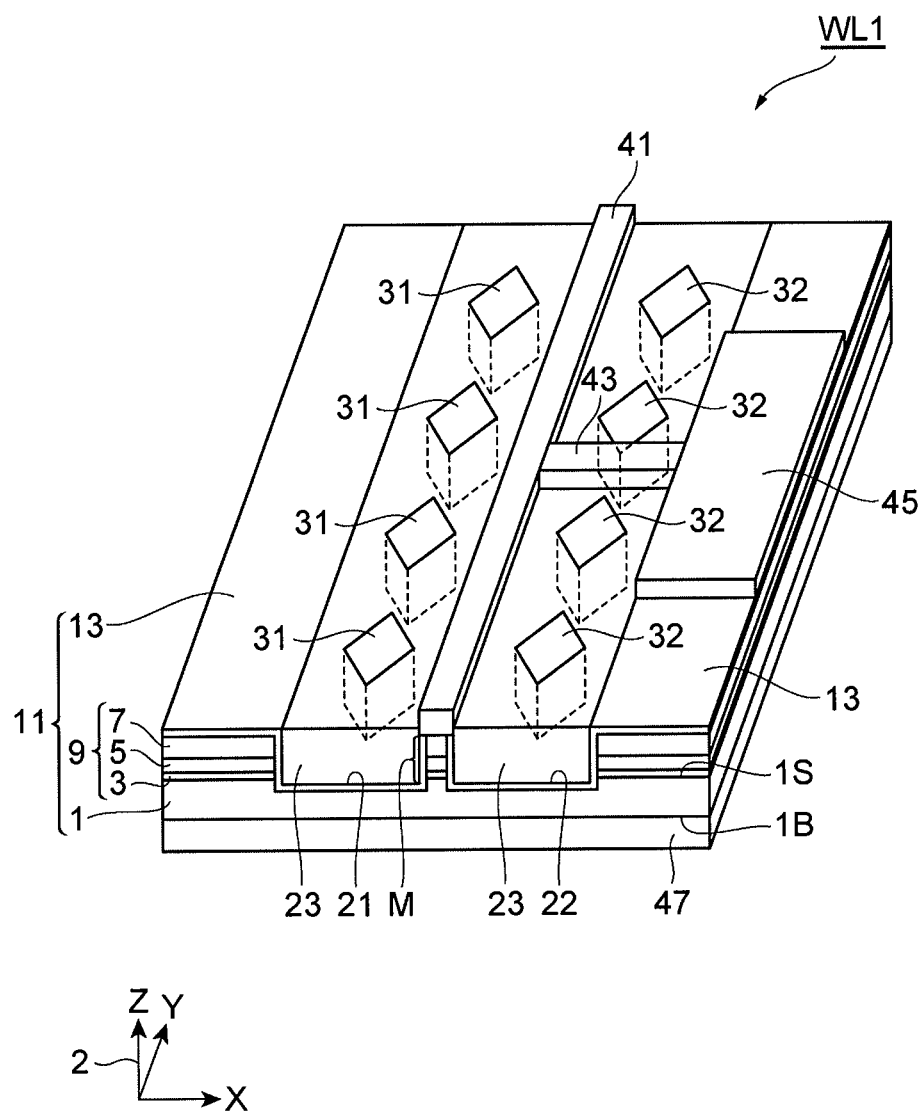
FIG. 1 is a perspective view illustrating a semiconductor laser device according to a first embodiment.

A waveguide-type optical semiconductor device according to an embodiment will be described in detail below with reference to the attached drawings. In the drawings, the same elements are designated using the same reference numerals, if possible. Dimensional ratios in an element and between elements are freely set for the sake of visibility.

First Embodiment

A waveguide-type optical semiconductor device according to a first embodiment will be described. The waveguide-type optical semiconductor device according to this embodiment is a semiconductor laser device.

FIG. 1 is a perspective view illustrating the semiconductor laser device according to this embodiment. As illustrated in FIG. 1, the semiconductor laser device WL1 according to this embodiment mainly includes a structure 11, a plurality of first protrusions 31, a plurality of second protrusions 32, and resin portions 23, the structure 11 including a semiconductor substrate 1, a stacked semiconductor layer 9, and a protective layer 13.

The semiconductor substrate 1 is composed of a semiconductor material having a first conductivity type (for example, n-type). For example, the semiconductor substrate 1 is composed of a III-V group compound semiconductor, such as InP. The semiconductor substrate 1 serves as a substrate in the embodiment. The semiconductor substrate 1 includes a substantially flat main surface 1S and a substantially flat back surface 1B opposite the main surface 1S. In FIG. 1 and the subsequent figures, a rectangular coordinate system 2 is illustrated. In the rectangular coordinate system 2, the X-axis and the Y-axis of the rectangular coordinate system 2 lie in directions parallel to the main surface 1S, and the Z-axis of the rectangular coordinate system 2 lies in the direction orthogonal to the main surface 1S.

The stacked semiconductor layer 9 is provided on the main surface 1S of the semiconductor substrate 1. The stacked semiconductor layer 9 includes a plurality of semiconductor layers stacked in the Z-axis direction. In this embodiment, the stacked semiconductor layer 9 includes a buffer layer 3 provided on the main surface 1S of the semiconductor substrate 1, an active layer 5 provided on the buffer layer 3, and an upper cladding layer 7 provided on the active layer 5. The active layer 5 functions as a core layer of an optical waveguide. The buffer layer 3 is composed of a first-conductivity-type semiconductor material, for example, a III-V group compound semiconductor, such as InP. The semiconductor substrate 1 and the buffer layer 3 function as a lower cladding for the active layer 5. The active layer 5 has, for example, a multi quantum well (MQW) structure or a single quantum well (SQW) structure and is composed of a III-V group compound semiconductor, such as undoped AlGaInAs.

The upper cladding layer 7 is composed of a semiconductor material of a second conductivity type (p-type when the first conductivity type is an n-type), for example, a III-V group compound semiconductor, such as InP.

Portions of the protective layer 13 are provided on regions of the upper cladding layer 7 other than regions where a first stripe-shaped groove 21 and a second stripe-shaped groove 22 described below are provided or a region between the first stripe-shaped groove 21 and the second stripe-shaped groove 22 (in other words, parts of the protective layer 13 are provided on regions of the upper cladding layer 7 positioned in the negative X-axis direction from the first stripe-shaped groove 21 and in the positive X-axis direction from the second stripe-shaped groove 22). The protective layer 13 is formed of a dielectric film composed of, for example, silicon dioxide ($SiO_2$) or silicon nitride (SiN).

In the structure 11, a pair of stripe-shaped grooves, i.e., the first stripe-shaped groove 21 and the second stripe-shaped groove 22, are provided. Each of the first stripe-shaped groove 21 and the second stripe-shaped groove 22 has a depth in the Z-axis direction and extends in the Y-axis direction (second direction). In this embodiment, each of the first stripe-shaped groove 21 and the second stripe-shaped groove 22 has a depth that extends from the upper surface of the structure 11 to an intermediate position of the semiconductor substrate 1 in the thickness direction. In this embodiment, each of the first stripe-shaped groove 21 and the second stripe-shaped groove 22 has a rectangular cross-sectional shape on a plane (XZ plane) orthogonal to the direction to which they extend.

The first stripe-shaped groove 21 and the second stripe-shaped groove 22 define a stripe-shaped mesa portion M. The mesa portion M is part of the structure 11. The mesa portion M protrudes in the Z-axis direction (first direction) and extends in the Y-axis direction. In this embodiment, the mesa portion M has a rectangular cross-sectional shape in a plane (XZ plane) orthogonal to the direction to which the mesa portion M extends.

Other portions of the protective layer 13 are provided on a region of the structure 11 in contact with a region of the bottom face of the first stripe-shaped groove 21 where the plural first protrusions 31 are not provided, regions of the structure 11 in contact with regions of side faces of the first stripe-shaped groove 21, a region of the structure 11 in contact with a region of the bottom face of the second stripe-shaped groove 22 where the plural second protrusions 32 are not provided, and regions of the structure 11 in contact with regions of side faces of the second stripe-shaped groove 22. In this embodiment, the mesa portion M is formed of parts of the semiconductor substrate 1, the buffer layer 3, the active layer 5, the upper cladding layer 7, and the protective layer 13.

The mesa portion M includes the semiconductor substrate 1, the buffer layer 3, the active layer 5, and the upper cladding layer 7. In this embodiment, the semiconductor substrate 1 and the buffer layer 3 serve as a lower cladding. The upper cladding layer 7 serves as an upper cladding. The active layer 5 sandwiched between the buffer layer 3 and the upper cladding layer 7 serves as a core of a waveguide. Therefore, the mesa portion M constitutes the waveguide having the lower cladding, the upper cladding, and the core between the lower and upper claddings. The mesa portion M extends in the Y-axis direction. In this embodiment, both facets of the mesa portion M in the Y-axis direction constitute mirrors of a laser cavity.

The plural first protrusions 31 are provided in the first stripe-shaped groove 21. The plural second protrusions 32 are provided in the second stripe-shaped groove 22. The plural first protrusions 31 and the plural second protrusions 32 constitute a protrusion portion in the embodiment. The first stripe-shaped groove 21 and the second stripe-shaped groove 22 are filled with the resin portions 23. Details of the plural first protrusions 31, the plural second protrusions 32, and the resin portions 23 will be described with reference to FIGS. 2 and 3.

Figure 2:
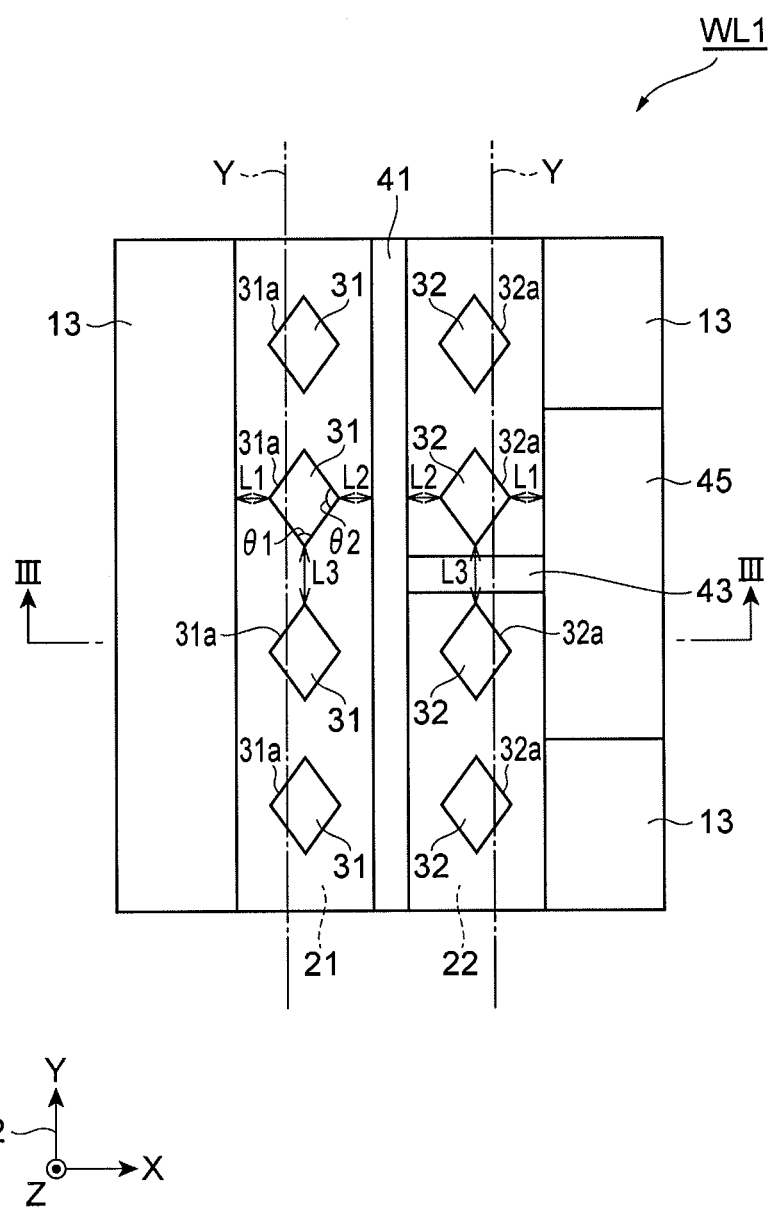
FIG. 2 is a top view of the semiconductor laser device illustrated in FIG. 1.
Figure 3:
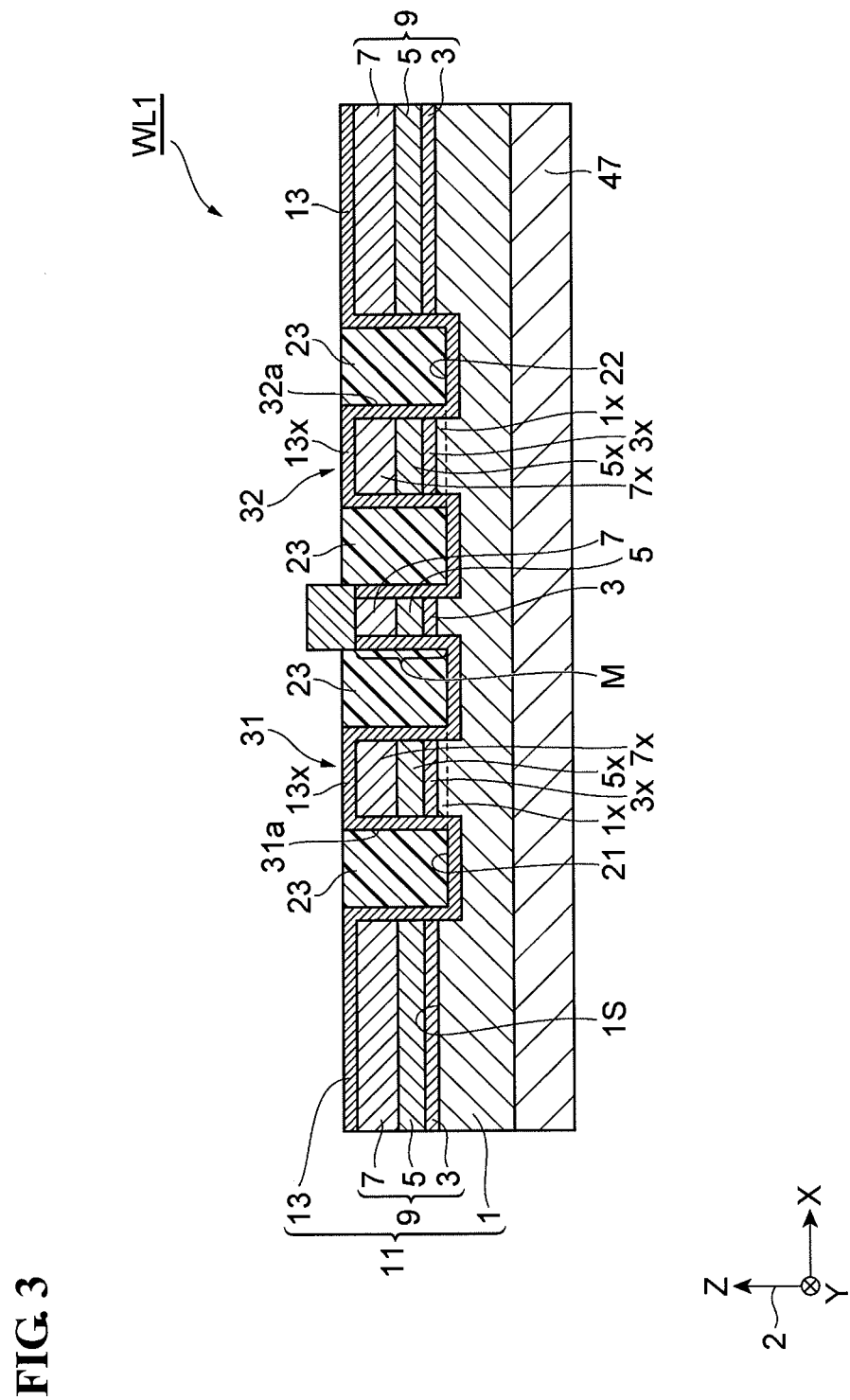
FIG. 3 is a cross-sectional view of the semiconductor laser device taken along line III-III in FIG. 2.

FIG. 2 is a top view of the semiconductor laser device illustrated in FIG. 1. FIG. 3 is a cross-sectional view of the semiconductor laser device taken along line in FIG. 2.

The plural first protrusions 31 and the plural second protrusions 32 have the same structure as one another. Specifically, the plural first protrusions 31 (or the second protrusions 32) are arranged in the first stripe-shaped groove 21 (or the second stripe-shaped groove 22) in the Y-axis direction as illustrated in FIGS. 2 and 3. Here, in FIG. 3, a boundary line between the first protrusions 31 (or the second protrusions 32) and the first stripe-shaped groove 21 (or the second stripe-shaped groove 22), i.e., a boundary line between the first protrusions 31 (or the second protrusions 32) and the structure 11, is represented by a broken line. Each of the plural first protrusions 31 (or the plural second protrusions 32) protrudes from the structure 11 in the Z-axis direction. The height of each of the plural first protrusions 31 (or the plural second protrusions 32) in the Z-axis direction is substantially equal to the depth of the first stripe-shaped groove 21 (or the second stripe-shaped groove 22) in the Z-axis direction. Each of the plural first protrusions 31 (or the plural second protrusions 32) partially occupies a region in the first stripe-shaped groove 21 (or the second stripe-shaped groove 22).

Relative positions of each of the plural first protrusions 31 (or the plural second protrusions 32) with respect to the structure 11 are fixed. Specifically, each of the plural first protrusions 31 (or the plural second protrusions 32) is in direct contact with and fixed on a surface of the structure 11 which defines the bottom face of the first stripe-shaped groove 21 (or the second stripe-shaped groove 22). In this embodiment, the plural first protrusions 31 (or the second protrusions 32) have the same structure as one another.

Side faces 31a (or side faces 32a) of each of the plural first protrusions 31 (or the plural second protrusions 32) all intersect with the Y-axis direction Y when viewed from the Z-axis direction. In this embodiment, each of the plural first protrusions 31 (or the plural second protrusions 32) has a substantially columnar shape with a height in the Z-axis direction as illustrated in FIG. 3. Each of the plural first protrusions 31 (or the plural second protrusions 32) has a substantially rhombic shape with a long diagonal that extends in the Y-axis direction Y when viewed from the Z-axis direction as illustrated in FIG. 2. Thus, each of the side faces 31a (or the side faces 32a) of the plural first protrusions 31 (or the plural second protrusions 32) intersects with the Y-axis direction Y.

Each of the plural first protrusions 31 (or the plural second protrusions 32) is spaced apart from the side faces of the first stripe-shaped groove 21 (or the second stripe-shaped groove 22) in the positive X-axis direction and the negative X-axis direction when viewed from the Z-axis direction. Letting a distance between each of the plural first protrusions 31 (or the plural second protrusions 32) and the side face of the first stripe-shaped groove 21 (or the second stripe-shaped groove 22) in the negative X-axis direction (or in the positive X-axis direction) be L1, and letting a distance between each of the plural first protrusions 31 (or the plural second protrusions 32) and the side face of the first stripe-shaped groove 21 (or the second stripe-shaped groove 22) in the positive X-axis direction (or in the negative X-axis direction) be L2, each of the distances L1 and L2 may be, for example, 0.5 µm or more and 3 µm or less.

The plural first protrusions 31 (or the plural second protrusions 32) are spaced apart from one another in the Y-axis direction when viewed from the Z-axis direction. Letting a distance from one of the plural first protrusions 31 (or the plural second protrusions 32) to another adjacent one of the first protrusions 31 (or the second protrusions 32) when viewed from the Z-axis direction be L3, the distance L3 may be, for example, 0.5 µm or more and 3 µm or less.

Angles $\theta 1$ and $\theta 2$ of the rhombic shape of each of the plural first protrusions 31 (or plural second protrusions 32) each may be 30° or more and 60° or less when viewed from the Z-axis direction. Preferably, one of the angles $\theta 1$ and $\theta 2$ may be 45°.

As described above, in this embodiment, each of the plural first protrusions 31 (or the plural second protrusions 32) has a substantially rhombic shape with a long diagonal that extends in the Y-axis direction Y when viewed from the Z-axis direction. Alternatively, each of the plural first protrusions 31 (or the plural second protrusions 32) may have a substantially rhombic shape with a long diagonal that forms an acute angle, 90°, or an obtuse angle with respect to the Y-axis direction.

In addition, each of the plural first protrusions 31 (or the plural second protrusions 32) may have a substantially columnar shape with a height in the Z-axis direction and may have a substantially rectangular shape (substantially square shape or substantially oblong shape) with side faces each intersecting with the Y-axis direction Y when viewed from the Z-axis direction. In this case, a diagonal of the rectangular shape may extend in the Y-axis direction or may extend in a direction that forms an acute angle or an obtuse angle with respect to the Y-axis direction, when viewed from the Z-axis direction.

As illustrated in FIG. 3, in this embodiment, each of the plural first protrusions 31 (the plural second protrusions 32) has the same stacked structure as a region of the structure 11 where the first stripe-shaped groove 21 and the second stripe-shaped groove 22 are not provided. Specifically, each of the plural first protrusions 31 (the plural second protrusions 32) has a stacked semiconductor layer including a first semiconductor layer 1x provided on the semiconductor substrate 1, a second semiconductor layer 3x provided on the first semiconductor layer 1x, a third semiconductor layer 5x provided on the second semiconductor layer 3x, and a fourth semiconductor layer 7x provided on the third semiconductor layer 5x.

The first semiconductor layer 1x is composed of the same material as the semiconductor substrate 1. The second semiconductor layer 3x has the same thickness as the buffer layer 3 and is composed of the same material as the buffer layer 3. The third semiconductor layer 5x has the same thickness as the active layer 5 and is composed of the same material as the active layer 5. The fourth semiconductor layer 7x has the same thickness as the upper cladding layer 7 and is composed of the same material as the upper cladding layer 7. Each of the plural first protrusions 31 (or the plural second protrusions 32) includes a protective layer 13x that covers top faces and side faces of the first semiconductor layer 1x, the second semiconductor layer 3x, the third semiconductor layer 5x, and the fourth semiconductor layer 7x. The protective layer 13x is composed of the same material as the protective layer 13.

As illustrated in FIG. 3, the resin portions 23 are buried in the first stripe-shaped groove 21 and the second stripe-shaped groove 22. The resin portions 23 are provided so as to cover the side faces 31a of the plural first protrusions 31. As described above, each of the plural first protrusions 31 (or the plural second protrusions 32) occupies part of the region in the first stripe-shaped groove 21 (or the second stripe-shaped groove 22). The resin portions 23 occupy at least part and preferably substantially the whole of the remaining region in the first stripe-shaped groove 21 and the second stripe-shaped groove 22. Thus, projections and recesses formed on the top face of the structure 11 by forming the first stripe-shaped groove 21 and the second stripe-shaped groove 22 are planarized with the resin portions 23.

The resin portions 23 are composed of a resin, such as benzocyclobutene (BCB) resin or polyimide resin.

If an upper electrode 41 or an electrical interconnection 43 described below (see FIG. 1) is partially present in the first stripe-shaped groove 21 or the second stripe-shaped groove 22, an optical loss due to the scattering and absorption of light propagating through the waveguide formed of the mesa portion M is increased. The presence of the resin portions 23 easily prevents the upper electrode 41 or the electrical interconnection 43 described below (see FIG. 1) from being partially located in the first stripe-shaped groove 21 or the second stripe-shaped groove 22.

As illustrated in FIG. 1, the upper electrode 41 is provided on the upper cladding layer 7 of the mesa portion M. As with the mesa portion M, the upper electrode 41 extends in the Y-axis direction. The upper electrode 41 is composed of a metal material and formed of, for example, a stacked metal layer of Au/Zn/Au. The upper electrode 41 forms an ohmic contact with the mesa portion M. The upper electrode 41 may be in direct contact with the upper cladding layer 7 or may be provided on a contact layer provided on the upper cladding layer 7. The contact layer is composed of a III-V group compound semiconductor, such as InGaAsP or InGaAs.

A bonding pad 45 composed of a metal, such as Au, is provided on a region of the structure 11 positioned in the positive X-axis direction from the second stripe-shaped groove 22. The electrical interconnection 43 is provided on the resin portions 23 in the second stripe-shaped groove 22. The electrical interconnection 43 is composed of a metal material and formed of, for example, a stacked metal layer of Ti/Pt/Au. The electrical interconnection 43 electrically connects the upper electrode 41 to the bonding pad 45. The bonding pad 45 is composed of a metal material and formed of, for example, a stacked metal layer of Ti/Pt/Au.

A lower electrode 47 is provided on the back surface 1B of the semiconductor substrate 1. The lower electrode 47 is composed of a metal material and formed of, for example, a stacked metal layer of Au/Ge/Ti/Pt/Au. The lower electrode 47 forms an ohmic contact with the semiconductor substrate 1.

A method for producing the waveguide-type optical semiconductor device according to the first embodiment will be described below. The method for producing the waveguide-type optical semiconductor device according to this embodiment includes a structure formation step, a resin portion formation step, and an electrode formation step.

Structure Formation Step

FIGS. 4 to 7 are perspective views illustrating the structure formation step. The structure formation step includes a stacked semiconductor layer formation step, an etching step, and a protective film formation step.

Stacked Semiconductor Layer Formation Step

Figure 4:
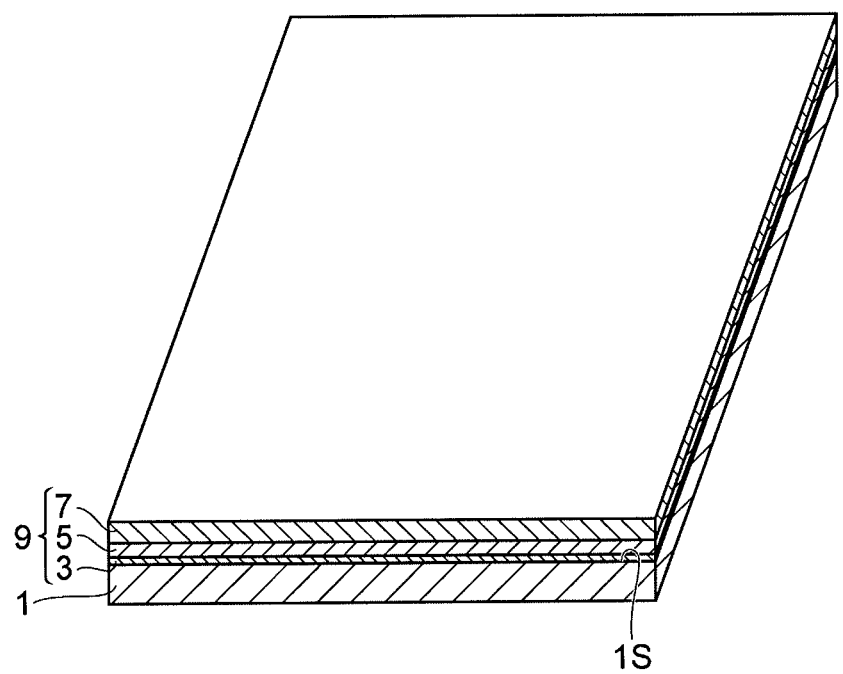
FIG. 4 is a perspective view illustrating a step of forming a structure.
Figure 4:
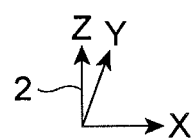

In the stacked semiconductor layer formation step, the semiconductor substrate 1 is prepared as illustrated in FIG. 4. The buffer layer 3, the active layer 5, and the upper cladding layer 7 are grown, in that order, on the main surface 1S of the semiconductor substrate 1 by an epitaxial growth method, such as a metal organic chemical vapor deposition (MOCVD) method. In this way, the stacked semiconductor layer 9 including the buffer layer 3, the active layer 5, and the upper cladding layer 7 is formed on the semiconductor substrate 1.

Etching Step

Figure 5:
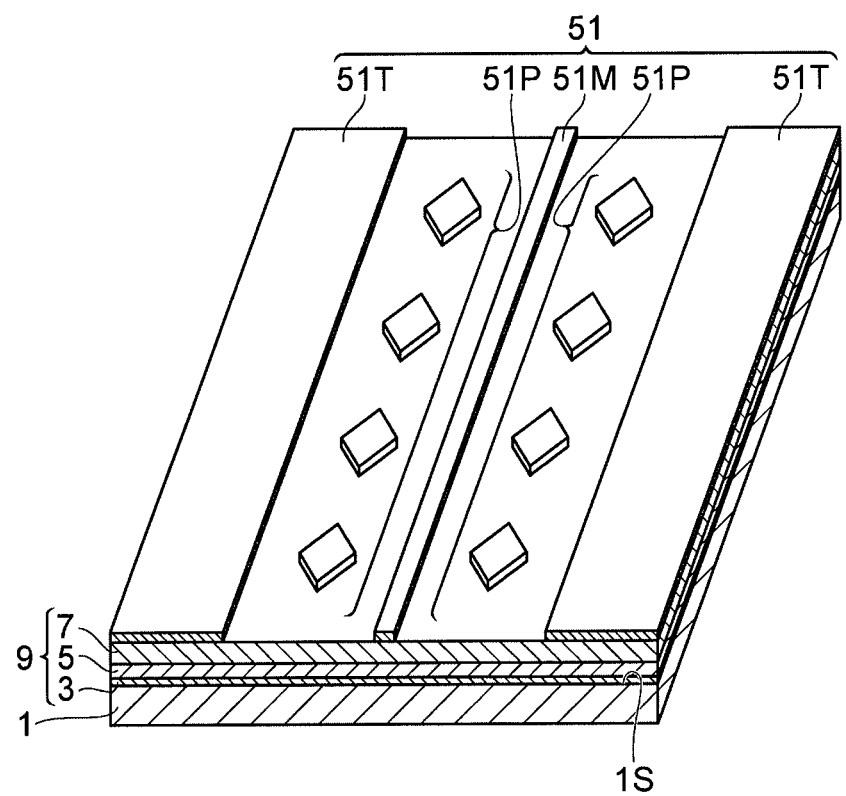
FIG. 5 is a perspective view illustrating a step of forming a structure.

Next, the etching step is performed. In this step, a mask 51 is formed on the upper cladding layer 7 of the stacked semiconductor layer 9 as illustrated in FIG. 5. The mask 51 is formed of a dielectric film composed of, for example, silicon dioxide ($SiO_2$) or silicon nitride (SiN).

The mask 51 includes a first region 51M, second regions 51P, and third regions 51T. The first region 51M covers a region of the stacked semiconductor layer 9 to be formed into a mesa portion Mx (see FIG. 6). The second regions 51P cover regions of the structure 11 to be formed into a plurality of first protrusions 31x and a plurality of second protrusions 32x (see FIG. 6). The third regions 51T cover a region of the structure 11 positioned in the negative X-axis direction from a region to be formed into a first stripe-shaped groove 21x and a region of the structure 11 positioned in the positive X-axis direction from a region to be formed into a second stripe-shaped groove 22x (see FIG. 6). That is, the mask 51 has openings each having a predetermined shape. The openings are formed on regions of the stacked semiconductor layer 9 where the first stripe-shaped groove 21x and the second stripe-shaped groove 22x will be formed and where the plural first protrusions 31x and the plural second protrusions 32x will not be formed.

The mask 51 may be formed by, for example, forming a dielectric film composed of, for example, silicon dioxide ($SiO_2$) or silicon nitride (SiN), on the entire upper surface of the upper cladding layer 7 by a deposition method, such as a chemical vapor deposition (CVD) method, and then patterning the resulting dielectric film into a predetermined shape by photolithography.

Figure 6:
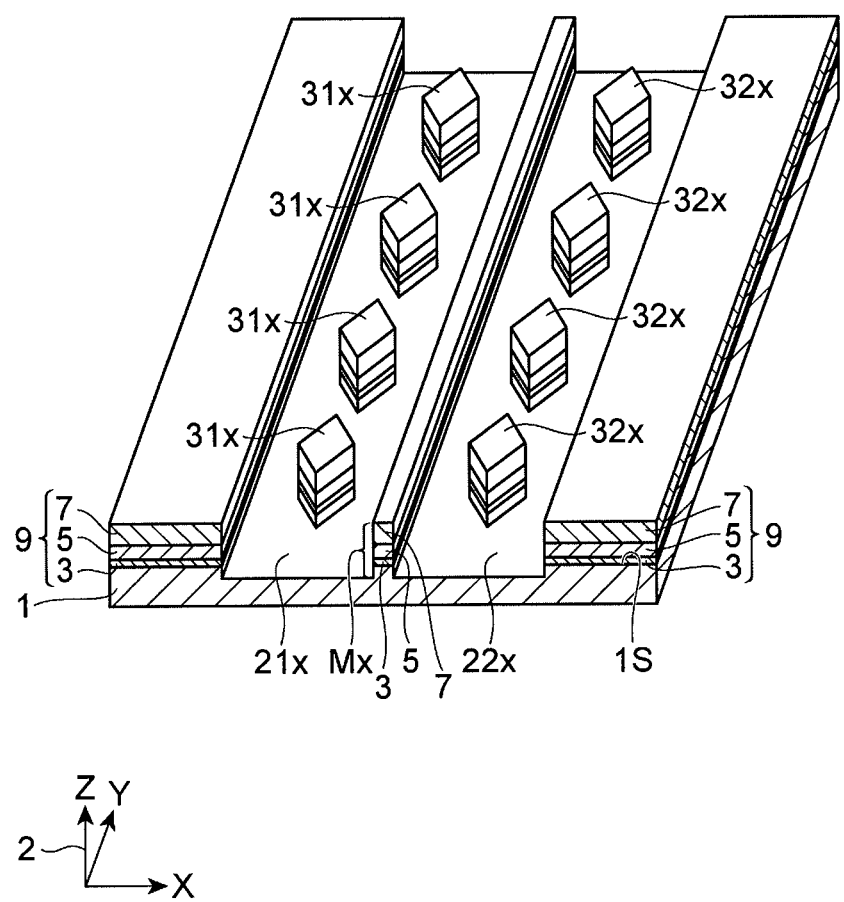
FIG. 6 is a perspective view illustrating a step of forming a structure.

As illustrated in FIG. 6, the stacked semiconductor layer 9 and the semiconductor substrate 1 are etched by, for example, a dry etching process with the mask 51 by a predetermined depth. The dry etching may be performed by an inductive coupled plasma reactive ion etching (ICP-RIE) method with hydrogen iodide (HI) gas as an etching gas. The mask 51 is then removed by, for example, a wet etching technique with hydrofluoric acid or the like as an etching solution.

Thereby, the first stripe-shaped groove 21x, the second stripe-shaped groove 22x, the mesa portion Mx, the first protrusions 31x, and the second protrusions 32x are formed. The first stripe-shaped groove 21x, the second stripe-shaped groove 22x, the mesa portion Mx, the first protrusions 31x, and the second protrusions 32x are precursor structures of the first stripe-shaped groove 21, the second stripe-shaped groove 22, the mesa portion M, the plural first protrusions 31, and the plural second protrusions 32, respectively (see FIG. 7).

The predetermined depth may be, for example, 3 μm or more and 4 μm or less. In this embodiment, the stacked semiconductor layer 9 and the semiconductor substrate 1 are etched to an intermediate position of the semiconductor substrate 1 in the thickness direction. Alternatively, for example, the stacked semiconductor layer 9 may be etched to an intermediate position of the stacked semiconductor layer 9 in the thickness direction.

Protective Film Formation Step

Figure 7:
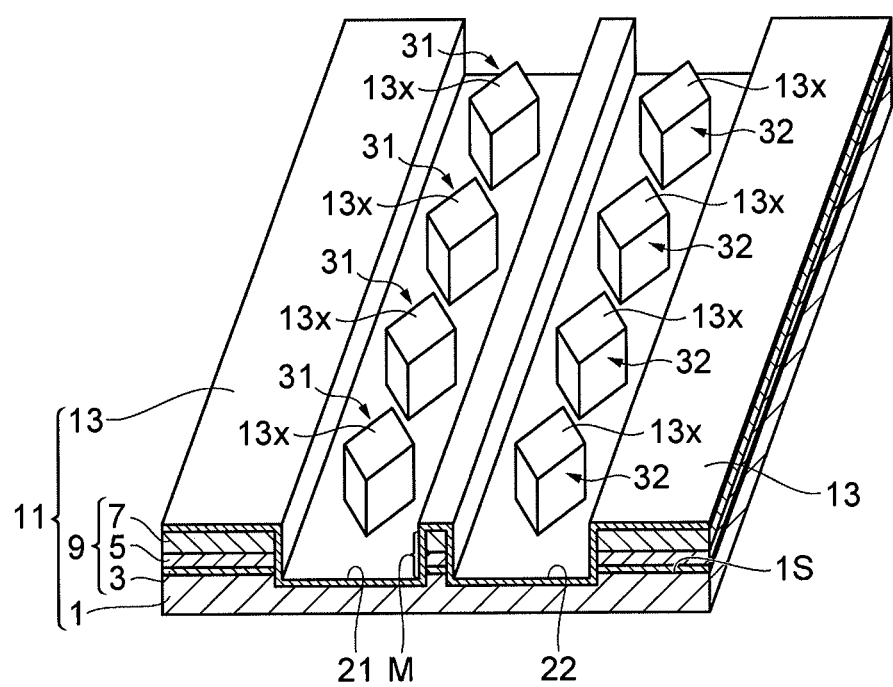
FIG. 7 is a perspective view illustrating a step of forming a structure.

Subsequently, the protective film formation step is performed. In this step, the protective layer 13 and the protective layer 13x are formed on all exposed surfaces of the semiconductor substrate 1, the stacked semiconductor layer 9, the first protrusions 31x, and the second protrusions 32x (i.e., the upper surface of the upper cladding layer 7, the bottom face and a side face of the first stripe-shaped groove 21x (a side face of the mesa portion Mx), the bottom face and a side face of the second stripe-shaped groove 22x (a side face of the mesa portion Mx), the upper surface of the fourth semiconductor layer 7x of the mesa portion Mx, the upper surface and side faces of each of the first protrusions 31x, and the upper surface and side faces of each of the second protrusions 32x) as illustrated in FIG. 7. The protective layer 13 and the protective layer 13x may be formed by, for example, depositing a dielectric film composed of, for example, silicon dioxide ($SiO_2$) or silicon nitride (SiN), on all the exposed surfaces of the semiconductor substrate 1, the stacked semiconductor layer 9, the first protrusions 31x, and the second protrusions 32x by a deposition method, such as a chemical vapor deposition (CVD) method.

Thereby, the structure 11 including the semiconductor substrate 1, the stacked semiconductor layer 9, and the protective layer 13, the plural first protrusions 31, and the plural second protrusions 32. The first stripe-shaped groove 21 and the second stripe-shaped groove 22 are formed in the structure 11. The first stripe-shaped groove 21 and the second stripe-shaped groove 22 define the mesa portion M.

Resin Portion Formation Step

Figure 8:
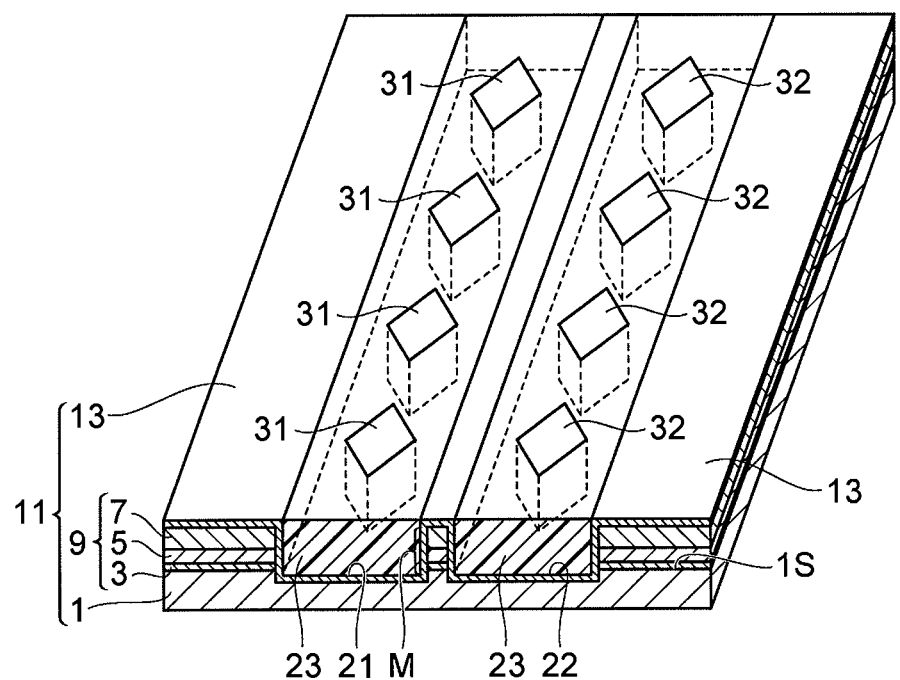
FIG. 8 is a perspective view illustrating a step of forming a resin portion.
Figure 8:
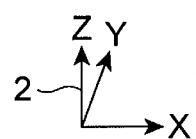

Next, the resin portion formation step is performed. FIG. 8 is a perspective view illustrating the resin portion formation step. In this step, after a resin is applied on the structure 11 by a coating method, such as spin coating, the resin is cured, as needed. An excess of the resin (resin present outside the first stripe-shaped groove 21 and the second stripe-shaped groove 22) is removed by a dry etching process, such as a plasma reactive ion etching (RIE) method. Thereby, the resin portions 23 buried in the first stripe-shaped groove 21 and the second stripe-shaped groove 22 are formed as illustrated in FIG. 8.

Electrode Formation Step

Figure 9:
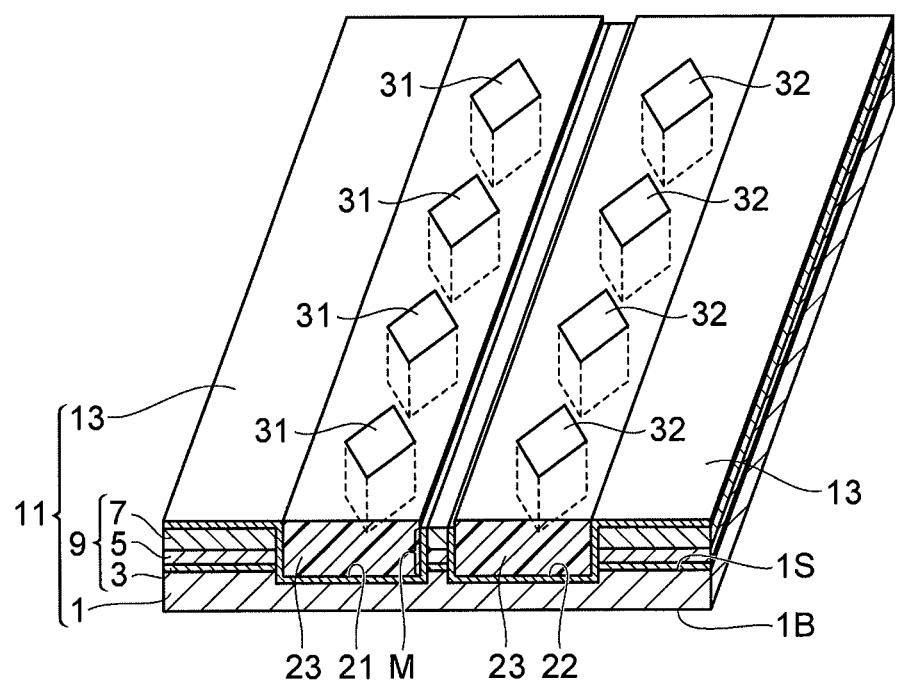
FIG. 9 is a perspective view illustrating a step of forming an electrode.
Figure 9:
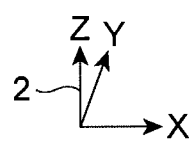

Next, the electrode formation step is performed. FIG. 9 is a perspective view illustrating the electrode formation step. In this step, a region of the protective layer 13 on the mesa portion M is removed by a dry etching process, such as a reactive ion etching (RIE) method with carbon tetrafluoride ($CF_4$) gas or oxygen ($O_2$) gas as an etching gas, as illustrated in FIG. 9, thereby exposing the upper cladding layer 7 of the mesa portion M.

Subsequently, the upper electrode 41 extending in the Y-axis direction is formed on the upper cladding layer 7 of the mesa portion M by, for example, an evaporation method. By, for example, an evaporation method and a plating method, the electrical interconnection 43 is formed on the resin portion 23 in the second stripe-shaped groove 22, and the bonding pad 45 is formed on a region positioned in the positive X-axis direction from the second stripe-shaped groove 22. Specifically, a Ti layer, a Pt layer, and a Au layer, which serve as part of the electrical interconnection 43 and the bonding pad 45, are formed in that order by the deposition method. Then Au portions, which serve as the remainders of the electrical interconnection 43 and the bonding pad 45, are further deposited on the Au layer by the plating method. The back surface 1B of the semiconductor substrate 1 is polished until the thickness of the semiconductor substrate 1 is reduced to about 100 μm. The lower electrode 47 is then formed on the back surface 1B. Heat treatment of the element results in the formation of an ohmic contact between the upper electrode 41 and the mesa portion M and an ohmic contact between the lower electrode 47 and the semiconductor substrate 1. Cleavage of the structure 11 along the XZ plane forms mirrors for a laser cavity on both facets in the Y-axis direction. The structure 11 is cut at a predetermined position in the XY plane into a chip. The foregoing steps are performed to provide the semiconductor laser device WL1 as illustrated in FIG. 1.

The foregoing semiconductor laser device WL1 according to this embodiment includes the plural first protrusions 31 and the plural second protrusions 32 in the pair of stripe-shaped grooves (the first stripe-shaped groove 21 and the second stripe-shaped groove 22). This results in a reduction in the volume of the resin portions 23 buried in the first stripe-shaped groove 21 and the second stripe-shaped groove 22 (see FIGS. 1 to 3), thereby achieving a reduction in stress generated in the resin portions 23.

The plural first protrusions 31 and the plural second protrusions 32 are present in the first stripe-shaped groove 21 and the second stripe-shaped groove 22. Relative positions of the plural first protrusions 31 and the plural second protrusions 32 with respect to the structure 11 are fixed. The resin portions 23 cover the side faces 31a of the plural first protrusions 31 and the side faces 32a of the plural second protrusions 32. This results in an increase in the area of contact of the resin portions 23 with other elements (the structure 11, the plural first protrusions 31, and the plural second protrusions 32) that hold the resin portions 23, compared with the case where such a protrusion is not present (see FIGS. 1 to 3).

The side faces 31a of the plural first protrusions 31 and the side faces 32a of the plural second protrusions 32 intersect with a second direction (Y-axis direction) when viewed from the first direction (Z-axis direction). Thus, a stress acting in the second direction in the resin portions 23 and a stress acting in a direction (X-axis direction) orthogonal to the second direction are distributed in directions different from the directions in which these stresses act, thereby resulting in a uniformly distributed stress in the resin portions 23.

The effects as described above inhibit the detachment of the resin portions 23 from other elements (the structure 11, the plural first protrusions 31, and the plural second protrusions 32) during the curing of the resin portions 23, a step subsequent to the completion of the curing of the resin portions 23 (e.g., during the cleavage of the structure 11), and the use of the semiconductor laser device WL1.

In the semiconductor laser device WL1 according to this embodiment, the plural first protrusions 31 and the plural second protrusions 32 are arranged in the second direction (Y-axis direction) (see FIGS. 1 and 2). This results in a further increase in the area of contact of the resin portions 23 with other elements (the structure 11, the plural first protrusions 31, and the plural second protrusions 32) that hold the resin portions 23, thereby further inhibiting the detachment of the resin portions 23 from the above-referenced other elements.

In the semiconductor laser device WL1 according to this embodiment, the plural first protrusions 31 and the plural second protrusions 32 each have a substantially columnar shape with a height in the first direction (Z-axis direction) and has a substantially rhombic shape or substantially rectangular shape when viewed from the first direction (see FIGS. 1 to 3). Thus, a stress acting in the second direction in the resin portions 23 and a stress acting in a direction (X-axis direction) orthogonal to the second direction are efficiently distributed in directions different from the directions in which these stresses act, thereby resulting in a more uniformly distributed stress in the resin portions 23. This further inhibits the detachment of the resin portions 23 from the above-referenced other elements.

Second Embodiment

A waveguide-type optical semiconductor device according to a second embodiment will be described below. In the descriptions of the second embodiment and the subsequent embodiments, points different from other embodiments will be mainly described. Elements similar to those in other embodiments are designated using the same reference numerals, and descriptions are not redundantly repeated, in some cases.

Figure 10:
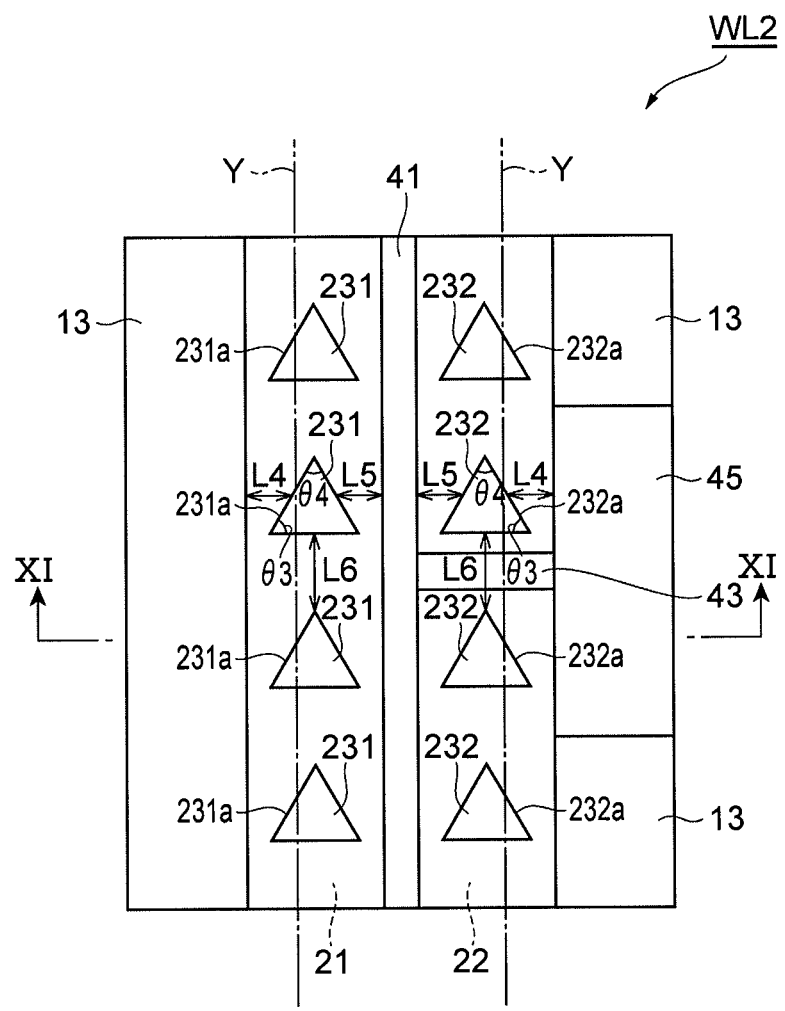
FIG. 10 is a top view of a semiconductor laser device according to a second embodiment.
Figure 11:
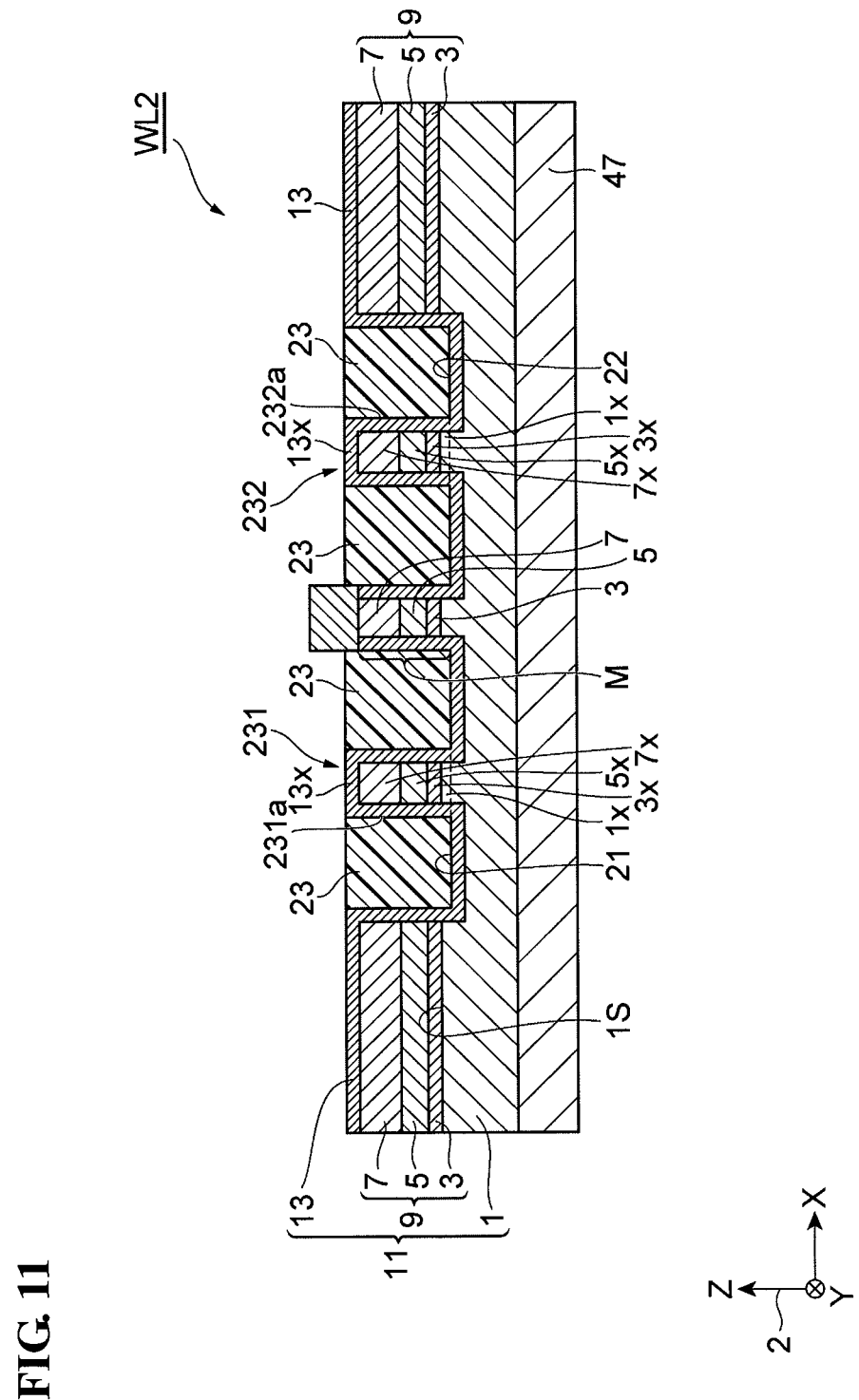
FIG. 11 is a cross-sectional view of the semiconductor laser device taken along line XI-XI in FIG. 10.

As with the first embodiment, the waveguide-type optical semiconductor device according to this embodiment is a semiconductor laser device. FIG. 10 is a top view of the semiconductor laser device according to the second embodiment. FIG. 11 is a cross-sectional view of the semiconductor laser device taken along line XI-XI in FIG. 10.

As illustrated in FIGS. 10 and 11, the semiconductor laser device WL2 according to this embodiment differs in the shape of a plurality of first protrusions and a plurality of second protrusions from the semiconductor laser device WL1 according to the first embodiment.

Specifically, in this embodiment, each of the plural first protrusions 231 (or the plural second protrusions 232) has a substantially triangular shape with a side substantially orthogonal to the Y-axis direction Y when viewed from the Z-axis direction, as illustrated in FIG. 10. As with the case of the first embodiment, side faces 231a (or side faces 232a) of the plural first protrusions 231 (or the plural second protrusions 232) each intersect with the Y-axis direction Y when viewed from the Z-axis direction as illustrated in FIG. 10. Each of the plural first protrusions 231 (or the plural second protrusions 232) has a substantially columnar shape with a height in the Z-axis direction as illustrated in FIG. 11.

Letting a distance between the middle point of a side of each of the plural first protrusions 231 (or the plural second protrusions 232) facing a side face of the first stripe-shaped groove 21 (or the second stripe-shaped groove 22) in the negative x-axis direction (or in the positive X-axis direction) and the side face be L4, and letting a distance between the middle point of a side of each of the plural first protrusions 231 (or the plural second protrusions 232) facing a side face of the first stripe-shaped groove 21 (or the second stripe-shaped groove 22) in the positive x-axis direction (or in the negative X-axis direction) and the side face be L5, each of the distances L4 and L5 may be, for example, 0.5 µm or more and 3 µm or less.

The plural first protrusions 231 (or the plural second protrusions 232) are spaced apart from one another in the Y-axis direction when viewed from the Z-axis direction. Letting a distance from one of the plural first protrusions 231 (or the plural second protrusions 232) to another adjacent one of the plural first protrusions 231 (or the plural second protrusions 232) when viewed from the Z-axis direction be L6, the distance L6 may be, for example, 0.5 µm or more and 3 µm or less.

Angles θ3 and θ4 of the triangular shape of each of the plural first protrusions 231 (or plural second protrusions 232) each may be 15° or more and 75° or less and preferably 60° when viewed from the Z-axis direction.

As described above, in this embodiment, each of the plural first protrusions 231 (or the plural second protrusions 232) has a substantially triangular shape with a side orthogonal to the Y-axis direction Y when viewed from the Z-axis direction. Alternatively, each of the plural first protrusions 231 (or the plural second protrusions 232) may have a substantially triangular shape with the side that forms an acute angle or an obtuse angle with respect to the Y-axis direction Y.

In the semiconductor laser device WL2 according to this embodiment, the detachment of the resin portions 23 from other elements (the structure 11, the plural first protrusions 231, and the plural second protrusions 232) is inhibited during the curing of the resin portions 23, a step subsequent to the completion of the curing of the resin portions 23 (e.g., during the cleavage of the structure 11), and the use of the semiconductor laser device WL2, on the basis of the same reason as the semiconductor laser device WL1 according to the first embodiment.

Third Embodiment

A waveguide-type optical semiconductor device according to a third embodiment will be described below.

Figure 12:
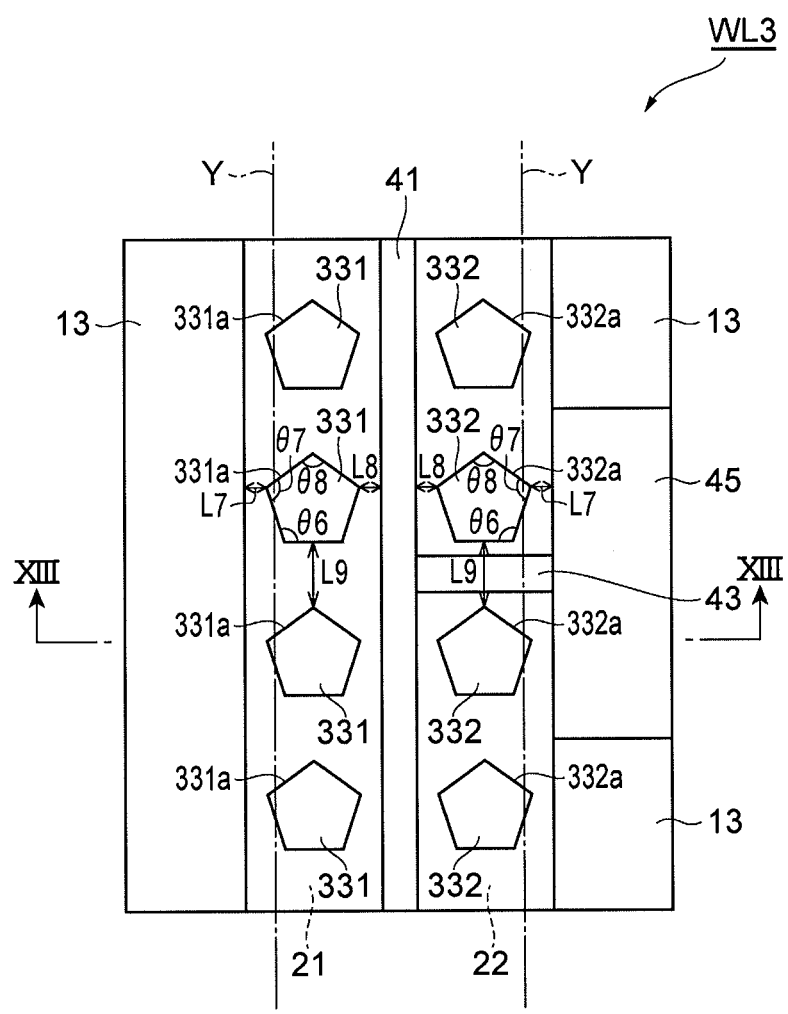
FIG. 12 is a top view of a semiconductor laser device according to a third embodiment.
Figure 13:
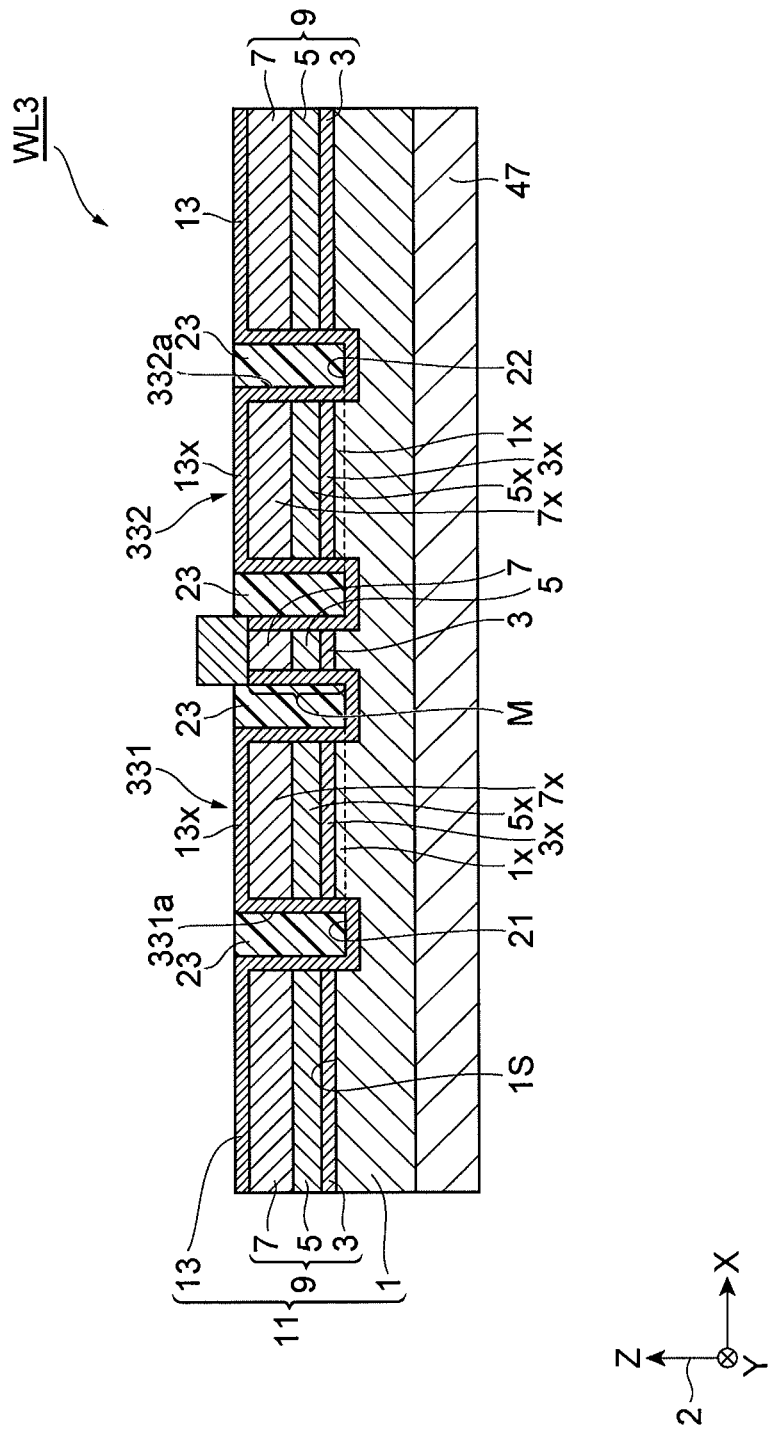
FIG. 13 is a cross-sectional view of the semiconductor laser device taken along line XIII-XIII in FIG. 12.

As with the first embodiment, the waveguide-type optical semiconductor device according to this embodiment is a semiconductor laser device. FIG. 12 is a top view of the semiconductor laser device according to the third embodiment. FIG. 13 is a cross-sectional view of the semiconductor laser device taken along line XIII-XIII in FIG. 12.

As illustrated in FIGS. 12 and 13, the semiconductor laser device WL3 according to this embodiment differs in the shape of a plurality of first protrusions and a plurality of second protrusions from the semiconductor laser device WL1 according to the first embodiment.

Specifically, in this embodiment, each of the plural first protrusions 331 (or the plural second protrusions 332) has a substantially pentagonal shape with a side substantially orthogonal to the Y-axis direction Y when viewed from the Z-axis direction, as illustrated in FIG. 12. As with the case of the first embodiment, side faces 331a (or side faces 332a) of the plural first protrusions 331 (or the plural second protrusions 332) each intersect with the Y-axis direction Y when viewed from the Z-axis direction as illustrated in FIG. 12. Each of the plural first protrusions 331 (or the plural second protrusions 332) has a substantially columnar shape with a height in the Z-axis direction as illustrated in FIG. 13.

Letting a distance between each of the plural first protrusions 331 (or the plural second protrusions 332) and a side face of the first stripe-shaped groove 21 (or the second stripe-shaped groove 22) in the negative X-axis direction (or in the positive X-axis direction) be L7, and letting a distance between each of the plural first protrusions 331 (or the plural second protrusions 332) and a side face of the first stripe-shaped groove 21 (or the second stripe-shaped groove 22) in the positive X-axis direction (or in the negative X-axis direction) be L8, each of the distances L7 and L8 may be, for example, 0.5 µm or more and 3 µm or less.

The plural first protrusions 331 (or the plural second protrusions 332) are spaced apart from one another in the Y-axis direction when viewed from the Z-axis direction. Letting a distance from one of the plural first protrusions 331 (or the plural second protrusions 332) to another adjacent one of the plural first protrusions 331 (or the plural second protrusions 332) when viewed from the Z-axis direction be L9, the distance L9 may be, for example, 0.5 µm or more and 3 µm or less.

Angles θ6, θ7, and θ8 of the pentagonal shape of each of the plural first protrusions 331 (or the plural second protrusions 332) each may be 54° or more and 162° or less when viewed from the Z-axis direction. Each of the angles θ6, θ7, and θ8 is preferably 108°.

As described above, in this embodiment, each of the plural first protrusions 331 (or the plural second protrusions 332) has a substantially pentagonal shape with a side orthogonal to the Y-axis direction Y when viewed from the Z-axis direction. Alternatively, each of the plural first protrusions 331 (or the plural second protrusions 332) may have a substantially pentagonal shape with the side that forms an acute angle or an obtuse angle with respect to the Y-axis direction Y.

In the semiconductor laser device WL3 according to this embodiment, the detachment of the resin portions 23 from other elements (the structure 11, the plural first protrusions 331, and the plural second protrusions 332) is inhibited during the curing of the resin portions 23, a step subsequent to the completion of the curing of the resin portions 23 (e.g., during the cleavage of the structure 11), and the use of the semiconductor laser device WL3, on the basis of the same reason as the semiconductor laser device WL1 according to the first embodiment.

Fourth Embodiment

A waveguide-type optical semiconductor device according to a fourth embodiment will be described below.

Figure 14:
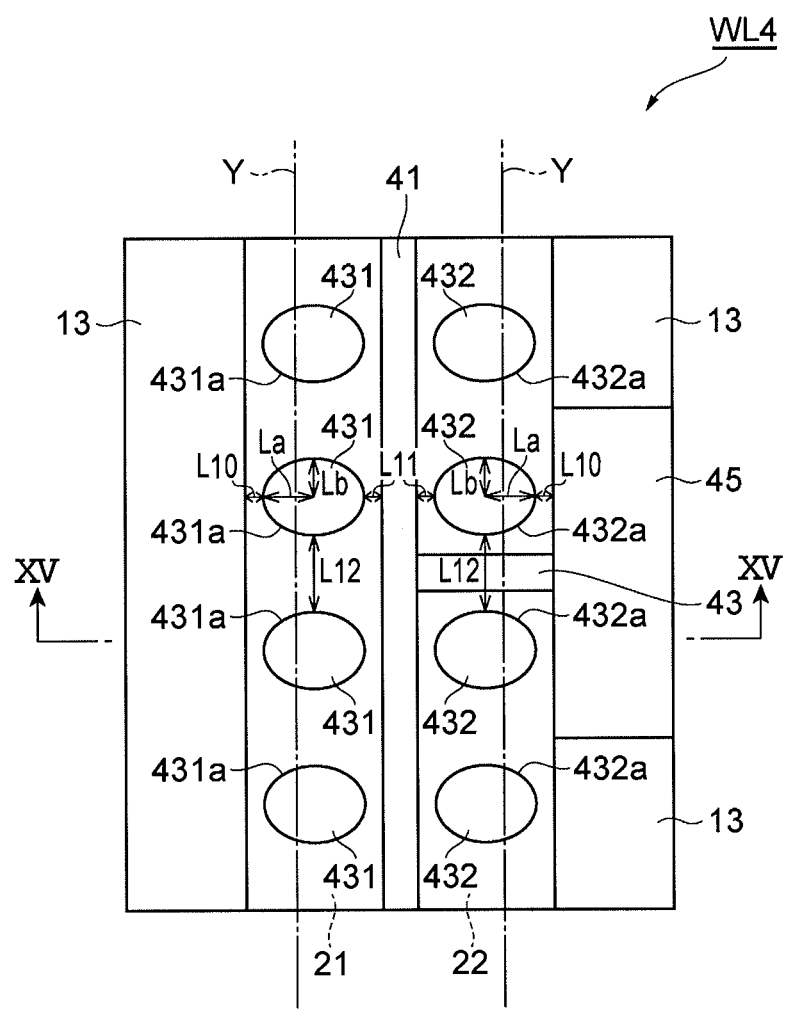
FIG. 14 is a top view of a semiconductor laser device according to a fourth embodiment.
Figure 15:
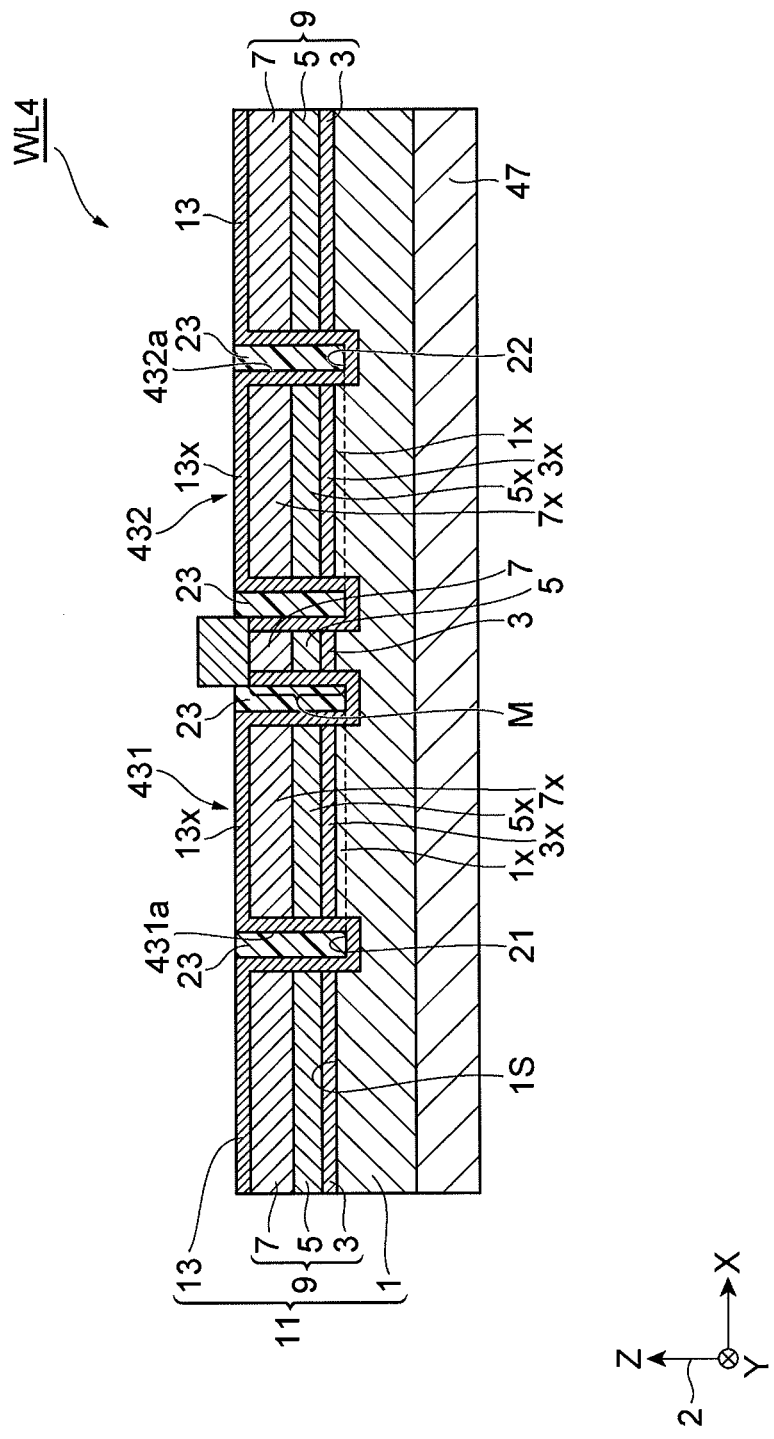
FIG. 15 is a cross-sectional view of the semiconductor laser device taken along line XV-XV in FIG. 14.

As with the first embodiment, the waveguide-type optical semiconductor device according to this embodiment is a semiconductor laser device. FIG. 14 is a top view of the semiconductor laser device according to the fourth embodiment. FIG. 15 is a cross-sectional view of the semiconductor laser device taken along line XV-XV in FIG. 14.

As illustrated in FIGS. 14 and 15, the semiconductor laser device WL4 according to this embodiment differs in the shape of a plurality of first protrusions and a plurality of second protrusions from the semiconductor laser device WL1 according to the first embodiment.

Specifically, in this embodiment, each of the plural first protrusions 431 (or the plural second protrusions 432) has a substantially elliptical shape with a minor axis that extends substantially in the Y-axis direction or has a substantially circular shape when viewed from the Z-axis direction, as illustrated in FIG. 14. Almost all side faces 431a (or side faces 432a) of the plural first protrusions 431 (or the plural second protrusions 432) intersect with the Y-axis direction Y when viewed from the Z-axis direction as illustrated in FIG. 14. Each of the plural first protrusions 431 (or the plural second protrusions 432) has a substantially columnar shape with a height in the Z-axis direction as illustrated in FIG. 15.

Letting a distance between each of the plural first protrusions 431 (or the plural second protrusions 432) and a side face of the first stripe-shaped groove 21 (or the second stripe-shaped groove 22) in the negative X-axis direction (or in the positive X-axis direction) be L10, and letting a distance between each of the plural first protrusions 431 (or the plural second protrusions 432) and a side face of the first stripe-shaped groove 21 (or the second stripe-shaped groove 22) in the positive X-axis direction (or in the negative X-axis direction) be L11, each of the distances L10 and L11 may be, for example, 0.5 µm or more and 3 µm or less.

The plural first protrusions 431 (or the plural second protrusions 432) are spaced apart from one another in the Y-axis direction when viewed from the Z-axis direction. Letting a distance from one of the plural first protrusions 431 (or the plural second protrusions 432) to another adjacent one of the plural first protrusions 431 (or the plural second protrusions 432) when viewed from the Z-axis direction be L12, the distance L12 may be, for example, 0.5 µm or more and 3 µm or less.

The ratio of the semi-major axis La to the semi-minor axis Lb, i.e., (La/Lb), of the elliptical or circular shape of each of the plural first protrusions 431 (or the plural second protrusions 432) when viewed from the Z-axis direction may be 0.5 or more and 2 or less and preferably 1.

As described above, in this embodiment, each of the plural first protrusions 431 (or the plural second protrusions 432) has a substantially elliptical shape with a minor axis that extends substantially in the Y-axis direction or has a substantially circular shape when viewed from the Z-axis direction. Alternatively, each of the plural first protrusions 431 (or the plural second protrusions 432) may have a substantially elliptical shape with the minor axis which intersects with the Y-axis direction Y at an acute angle or an obtuse angle or may have a substantially circular shape.

In the semiconductor laser device WL4 according to this embodiment, the detachment of the resin portions 23 from other elements (the structure 11, the plural first protrusions 431, and the plural second protrusions 432) is inhibited during the curing of the resin portions 23, a step subsequent to the completion of the curing of the resin portions 23 (e.g., during the cleavage of the structure 11), and the use of the semiconductor laser device WL4, on the basis of the same reason as the semiconductor laser device WL1 according to the first embodiment.

Fifth Embodiment

A waveguide-type optical semiconductor device according to a fifth embodiment will be described below.

Figure 16:
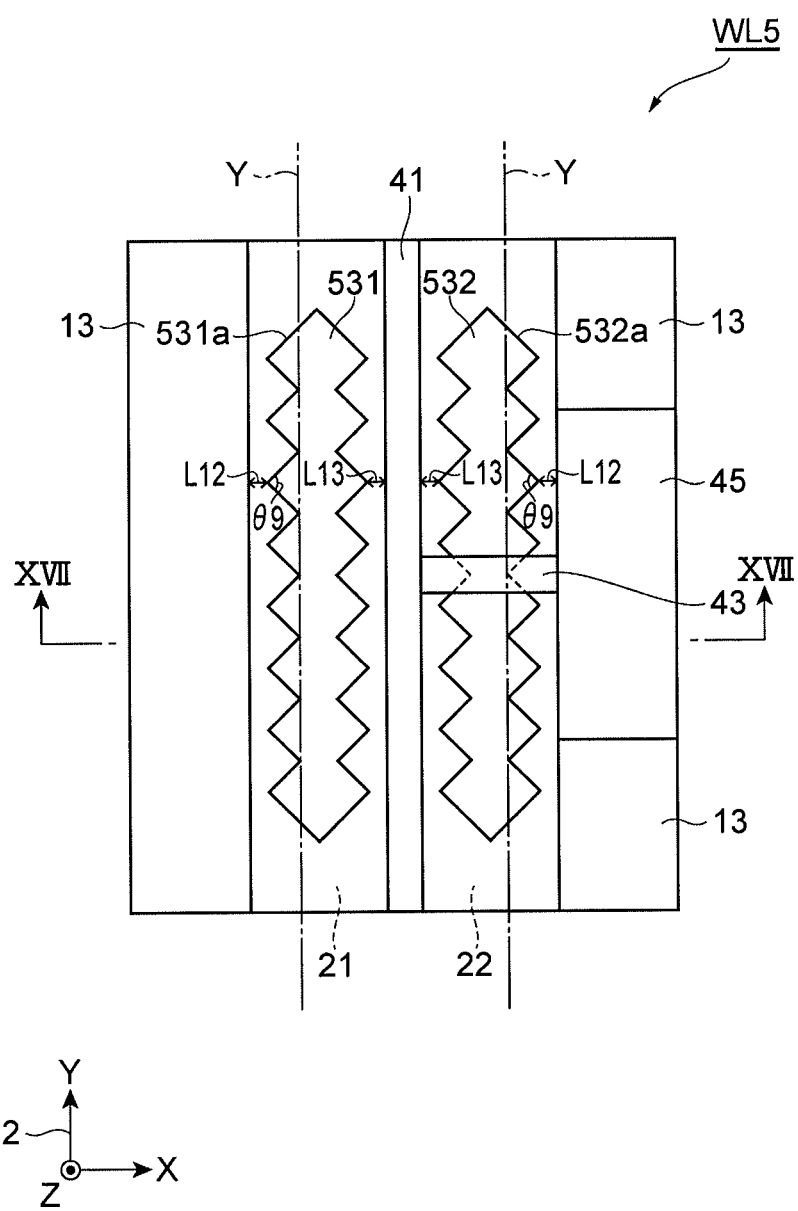
FIG. 16 is a top view of a semiconductor laser device according to a fifth embodiment.
Figure 17:
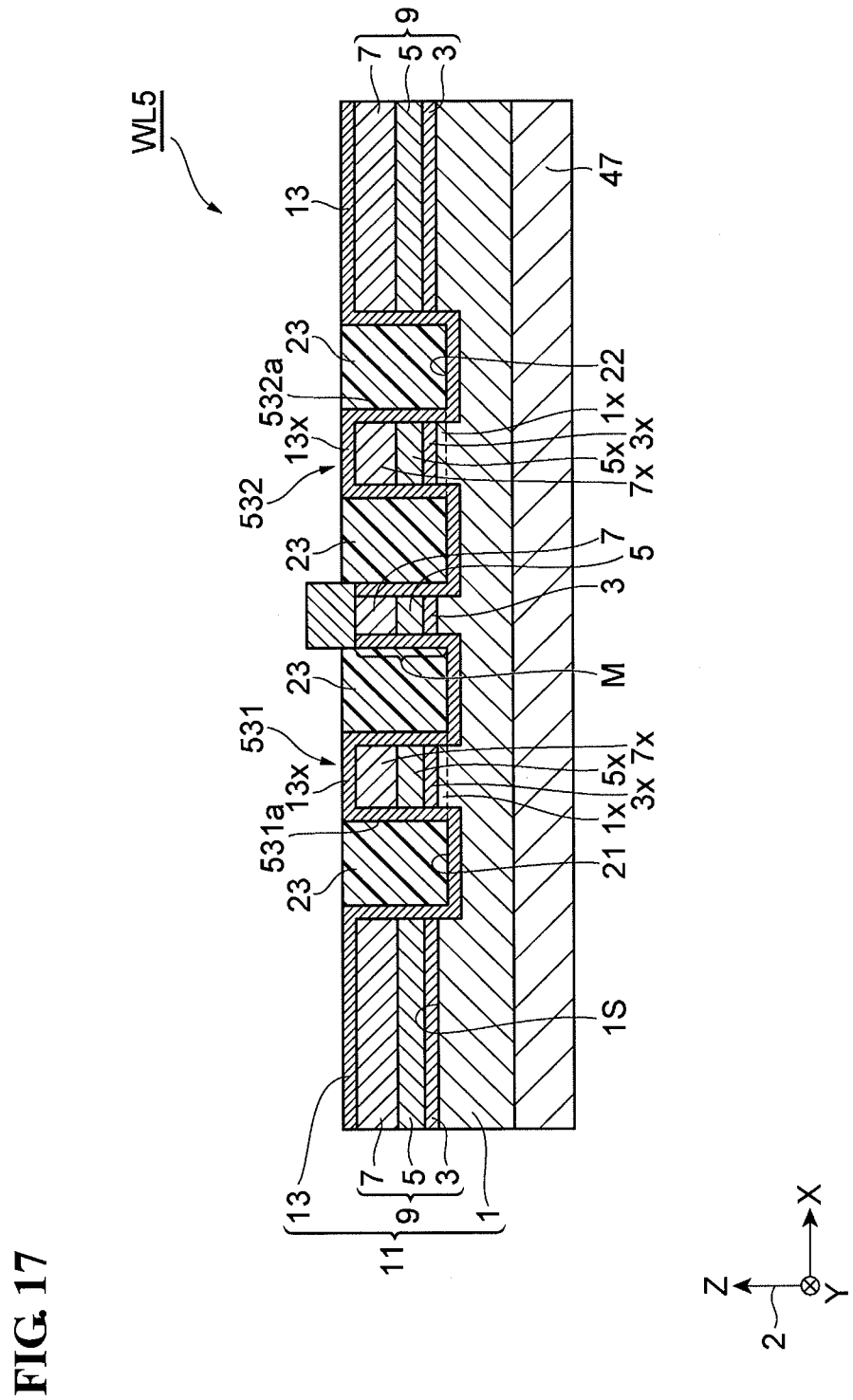
FIG. 17 is a cross-sectional view of the semiconductor laser device taken along line XVII-XVII in FIG. 16.

As with the first embodiment, the waveguide-type optical semiconductor device according to this embodiment is a semiconductor laser device. FIG. 16 is a top view of the semiconductor laser device according to the fifth embodiment. FIG. 17 is a cross-sectional view of the semiconductor laser device taken along line XVII-XVII in FIG. 16.

As illustrated in FIGS. 16 and 17, the semiconductor laser device WL5 according to this embodiment differs in the shape of a first protrusion and a second protrusion from the semiconductor laser device WL1 according to the first embodiment.

In this embodiment, the semiconductor laser device WL5 includes a single first protrusion 531 provided in the first stripe-shaped groove 21 and a single second protrusion 532 provided in the second stripe-shaped groove 22, as illustrated in FIG. 15. The first protrusion 531 (or the second protrusion 532) has a width W531 (or a width W532) in a direction (in the X-axis direction) orthogonal to the Y-axis direction Y when viewed from the Z-axis direction, and the first protrusion 531 (or the second protrusion 532) extends in the Y-axis direction Y with the width W531 (or the width W532) increased and decreased repeatedly.

Specifically, the first protrusion 531 (or the second protrusion 532) has a shape in which a plurality of rectangular portions having the same shape are aligned in the Y-axis direction Y in such a manner that diagonals of the rectangular portions are superposed on a straight line along the Y-axis direction Y and that adjacent rectangular portions overlap with each other, when viewed from the Z-axis direction. As with the case of the first embodiment, side faces 531a (or side faces 532a) of the first protrusion 531 (or the second protrusion 532) each intersect with the Y-axis direction Y when viewed from the Z-axis direction as illustrated in FIG. 16. The first protrusion 531 (or the second protrusion 532) has a substantially columnar shape with a height in the Z-axis direction as illustrated in FIG. 17.

Letting a distance between the first protrusion 531 (or the second protrusion 532) and a side face of the first stripe-shaped groove 21 (or the second stripe-shaped groove 22) in the negative X-axis direction (or in the positive X-axis direction) be L12, and letting a distance between the first protrusion 531 (or the second protrusion 532) and a side face of the first stripe-shaped groove 21 (or the second stripe-shaped groove 22) in the positive X-axis direction (or in the negative X-axis direction) be L13, each of the distances L12 and L13 may be, for example, 0.5 μm or more and 3 μm or less.

An angle θ9 of each of the rectangular portions constituting the shape of the first protrusion 531 (or the second protrusion 532) may be 30° or more and 60° or less and preferably 45° when viewed from the Z-axis direction.

As described above, in this embodiment, the first protrusion 531 (or the second protrusion 532) has a shape in which the plural rectangular portions having the same shape are aligned in the Y-axis direction Y in such a manner that the diagonals of the rectangular portions are superposed on a straight line along the Y-axis direction Y and that adjacent rectangular portions overlap with each other, when viewed from the Z-axis direction. Alternatively, the first protrusion 531 (or the second protrusion 532) may have a shape in which the plural rectangular portions are arranged in the Y-axis direction Y in such a manner that the diagonal of each of the rectangular portions forms an acute angle or an obtuse angle with respect to the single straight line along the Y-axis direction Y and that adjacent rectangular portions overlap with each other.

In the semiconductor laser device WL5 according to this embodiment, the first protrusion 531 and the second protrusion 532 have the width W531 and the width W532, respectively, in the direction (X-axis direction) orthogonal to the second direction when viewed from the first direction (Z-axis direction), and the first protrusion 531 and the second protrusion 532 extend in the second direction (Y-axis direction) with the width W531 and the width W532 increased and decreased repeatedly (see FIG. 16). This results in a further increase in the area of contact of the resin portions 23 with other elements (the structure 11, the first protrusion 531, and the second protrusion 532) that hold the resin portions 23, thereby further inhibiting the detachment of the resin portions 23 from the above-referenced other elements.

Sixth Embodiment

A waveguide-type optical semiconductor device according to a sixth embodiment will be described below.

Figure 18:
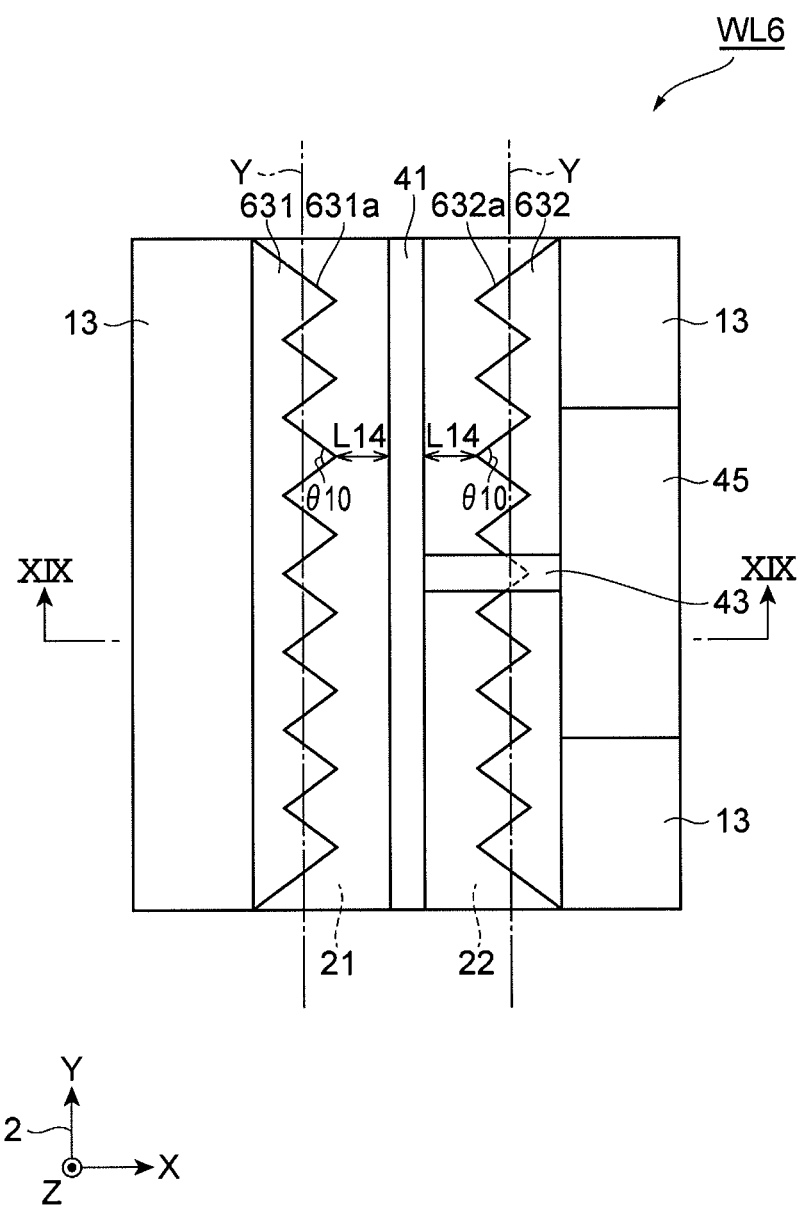
FIG. 18 is a top view of a semiconductor laser device according to a sixth embodiment.
Figure 19:
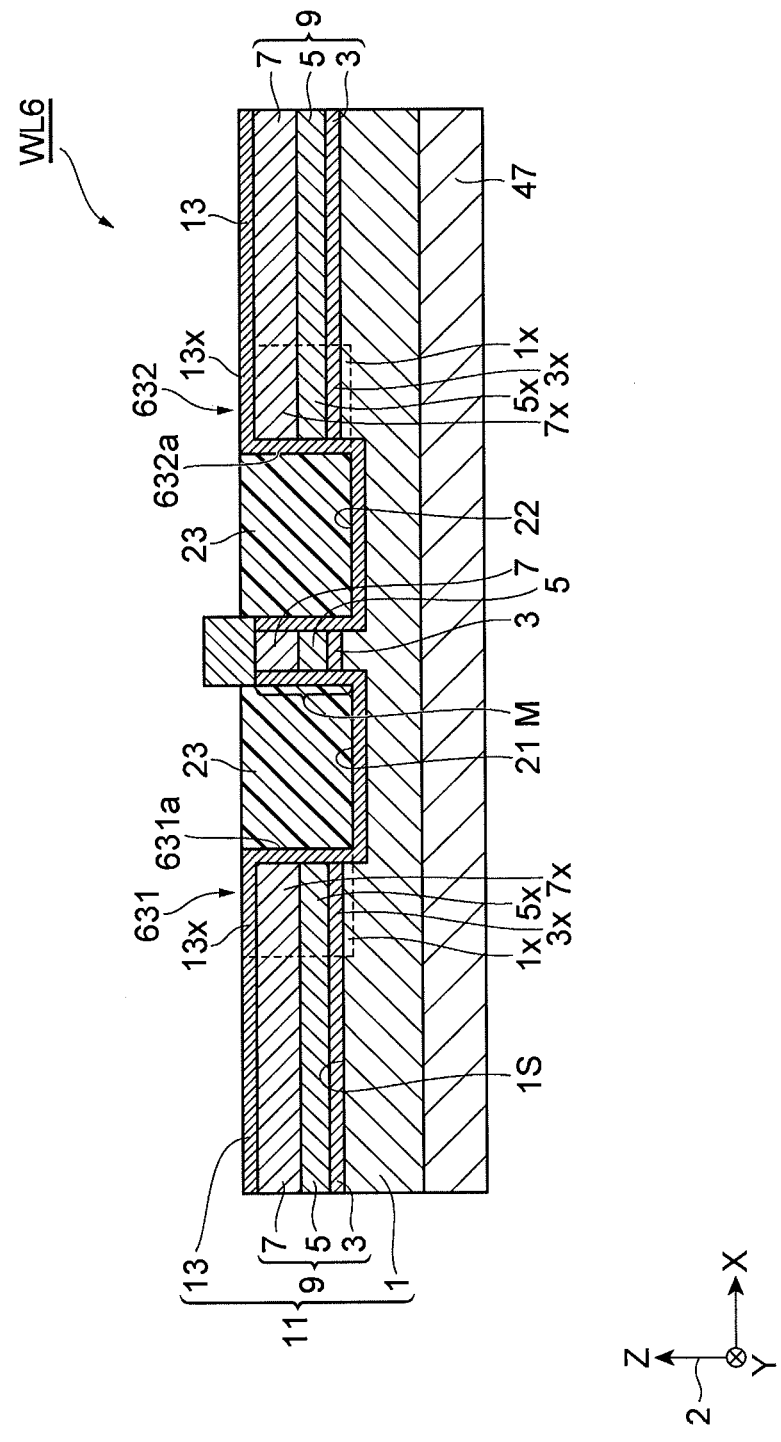
FIG. 19 is a cross-sectional view of the semiconductor laser device taken along line XIX-XIX in FIG. 18.

As with the fifth embodiment, the waveguide-type optical semiconductor device according to this embodiment is a semiconductor laser device. FIG. 18 is a top view of the semiconductor laser device according to the sixth embodiment. FIG. 19 is a cross-sectional view of the semiconductor laser device taken along line XIX-XIX in FIG. 18.

As illustrated in FIGS. 18 and 19, the semiconductor laser device WL6 according to this embodiment differs in the shape of a first protrusion and a second protrusion from the semiconductor laser device WL5 according to the fifth embodiment.

As with the case of the fifth embodiment, the semiconductor laser device WL6 according to this embodiment includes a single first protrusion 631 provided in the first stripe-shaped groove 21 and a single second protrusion 632 provided in the second stripe-shaped groove 22, as illustrated in FIG. 18. The first protrusion 631 (or the second protrusion 632) has a width W631 (or a width W632) in a direction (in the X-axis direction) orthogonal to the Y-axis direction Y when viewed from the Z-axis direction, and the first protrusion 631 (or the second protrusion 632) extends in the Y-axis direction Y with the width W631 (or the width W632) increased and decreased repeatedly.

Specifically, the first protrusion 631 (or the second protrusion 632) has a shape in which a plurality of triangular portions having the same shape are aligned in the Y-axis direction Y in such a manner that the bases of the triangular portions are superposed on a straight line along the Y-axis direction Y and that adjacent triangular portions overlap with each other, when viewed from the Z-axis direction. As with the case of the fifth embodiment, side faces 631a (or side faces 632a) of the first protrusion 631 (or the second protrusion 632) each intersect with the Y-axis direction Y when viewed from the Z-axis direction as illustrated in FIG. 18. The first protrusion 631 (or the second protrusion 632) has a substantially columnar shape with a height in the Z-axis direction as illustrated in FIG. 19.

The first protrusion 631 (or the second protrusion 632) adjoins a side face of the first stripe-shaped groove 21 (or the second stripe-shaped groove 22) in the negative X-axis direction (or in the positive X-axis direction) when viewed from the Z-axis direction.

Letting a distance between the first protrusion 631 (or the second protrusion 632) and a side face of the first stripe-shaped groove 21 (or the second stripe-shaped groove 22) in the positive X-axis direction (or in the negative X-axis direction) be L14, the distance L14 may be, for example, 0.5 μm or more and 3 μm or less.

An angle θ10 of each of the triangular portions constituting the shape of the first protrusion 631 (or the second protrusion 632) may be 15° or more and 75° or less and preferably 60° when viewed from the Z-axis direction.

As described above, in this embodiment, the first protrusion 631 (or the second protrusion 632) has a shape in which the plural triangular portions having the same shape are aligned in the Y-axis direction Y in such a manner that the bases of the triangular portions are superposed on a straight line along the Y-axis direction Y and that adjacent triangular portions overlap with each other, when viewed from the Z-axis direction. Alternatively, the first protrusion 631 (or the second protrusion 632) may have a shape in which the plural triangular portions are arranged in the Y-axis direction Y in such a manner that the base of each of the triangular portions forms an acute angle or an obtuse angle with respect to the single straight line along the Y-axis direction Y and that adjacent triangular portions overlap with each other.

In the semiconductor laser device WL6 according to this embodiment, the detachment of the resin portions 23 from other elements (the structure 11, the first protrusion 631, and the second protrusion 632) is further inhibited, on the basis of the same reason as the semiconductor laser device WL5 according to the fifth embodiment.

The present invention is not limited to the foregoing embodiments, and various modifications may be made.

For example, in the first to sixth embodiments described above, the first protrusions 31, 231, 331, 431, 531, and 631 and the second protrusions 32, 232, 332, 432, 532, and 632 each have a substantially columnar shape with a height in the Z-axis direction (see FIGS. 3, 11, 13, 15, 17, and 19). The first and second protrusions are not limited to the shape. For example, each of the first and second protrusions may have a conical shape, for example, a cone shape or a pyramidal shape, with a height in the Z-axis direction or may have a frustum shape, for example, a frustum of a cone or pyramid, with a height in the Z-axis direction.

In the first to sixth embodiments described above, the side faces 31a, 231a, 331a, 431a, 531a, and 631a of the first protrusions 31, 231, 331, 431, 531, and 631 and the side faces 32a, 232a, 332a, 432a, 532a, and 632a of the second protrusions 32, 232, 332, 432, 532, and 632 each intersect with the Y-axis direction Y when viewed from the Z-axis direction (see FIGS. 2, 10, 12, 14, 16, and 18). However, if some of the side faces intersect with the Y-axis direction Y when viewed from the Z-axis direction, others may not intersect with the Y-axis direction Y when viewed from the Z-axis direction.

In the first to fifth embodiments described above, the first protrusions 31, 231, 331, 431, and 531 and the second protrusions 32, 232, 332, 432, and 532 are each spaced apart from the side faces of the first stripe-shaped groove 21 (or the second stripe-shaped groove 22) in the positive X-axis direction and in the negative X-axis direction when viewed from the Z-axis direction (see FIGS. 2, 10, 12, 14, and 16). However, the first and second protrusions may be adjoined to one or both side faces.

In the semiconductor laser devices WL1, WL2, WL3, WL4, WL5, and WL6, the structures 11 may not include the protective layer 13. The first protrusions 31, 231, 331, 431, 531, and 631 and the second protrusions 32, 232, 332, 432, 532, and 632 may not include the protective layer 13x (see FIGS. 3, 11, 13, 15, 17, and 19).

In the first to fourth embodiments described above, while the plural first protrusions 31, 231, 331, and 431 have the same shape, they may have different shapes. Similarly, while the plural second protrusions 32, 232, 332, and 432 have the same shape, they may have different shapes (see FIGS. 2, 10, 12, and 14).

In the fifth and sixth embodiments described above, the side faces 531a and 631a of the first protrusions 531 and 631 and the side faces 532a and 632a of the second protrusions 532 and 632 each consist of a linear shape alone when viewed from the Z-axis direction (see FIGS. 16 and 18). However, some or all of the side faces may be curved when viewed from the Z-axis direction.

In the first to sixth embodiments described above, the first protrusions 31, 231, 331, 431, 531, and 631 and the second protrusions 32, 232, 332, 432, 532, and 632 each have the same stacked structure as a region of the structure 11 where the first stripe-shaped groove 21 and the second stripe-shaped groove 22 are not provided. However, they may not have the same stacked structure. The stacked structure may be composed of a material (e.g., a metal material) other than a semiconductor material.

In the first to sixth embodiments described above, the present invention is applied to the semiconductor laser devices. The present invention may also be applied to waveguide-type optical semiconductor devices, such as optical modulators, semiconductor optical amplifiers, light-sensitive elements, other than semiconductor laser devices.

Principles of the present invention have been described on the basis of preferred embodiments with reference to the drawings. However, those skilled in the art will understand that the embodiments can be changed in terms of details without departing from the principles. Therefore, all the modifications and changes within the scope and the spirit of Claims are claimed as the present invention.

What is claimed is:

1. A waveguide-type optical semiconductor device comprising:
    a substrate with a main surface;
    a structure including
        a stacked semiconductor layer including a core layer provided on the main surface of the substrate,
        a stripe-shaped mesa portion protruding in a first direction orthogonal to the main surface and extending in a second direction parallel to the main surface, and
        a pair of stripe-shaped grooves defining the stripe-shaped mesa portion and extending in the second direction;
    a protrusion portion provided in the pair of stripe-shaped grooves, the protrusion portion including at least one protrusion, the protrusion protruding from the structure in the first direction; and
    a resin portion covering a side face of the protrusion, the resin portion being buried in the stripe-shaped grooves,
    wherein the relative position of the protrusion with respect to the structure is fixed, and
    the side face of the protrusion intersects with the second direction when viewed from the first direction.

2. The waveguide-type optical semiconductor device according to claim 1,
    wherein the protrusion portion includes a plurality of protrusions, and
    wherein the plurality of protrusions are arranged in the second direction.

3. The waveguide-type optical semiconductor device according to claim 1,
    wherein the protrusion has a substantially columnar shape with a height in the first direction and has a substantially rhombic shape or a substantially rectangular shape when viewed from the first direction.

4. The waveguide-type optical semiconductor device according to claim 1,
    wherein the protrusion has a substantially columnar shape with a height in the first direction and has a substantially triangular shape or a substantially pentagonal shape with a side substantially orthogonal to the second direction when viewed from the first direction.

5. The waveguide-type optical semiconductor device according to claim 1,
    wherein the protrusion has a substantially columnar shape with a height in the first direction and has a substantially elliptical shape with a minor axis that extends substantially in the second direction or has a substantially circular shape when viewed from the first direction.

6. The waveguide-type optical semiconductor device according to claim 1,
- wherein the protrusion has a width in a direction orthogonal to the second direction when viewed from the first direction, and
- wherein the protrusion extends in the second direction with the width increased and decreased repeatedly.

7. The waveguide-type optical semiconductor device according to claim 1,
- wherein the resin portion is composed of a benzocyclobutene resin or a polyimide resin.

8. The waveguide-type optical semiconductor device according to claim 1,
- wherein the core layer in the stacked semiconductor layer is included in the stripe-shaped mesa portion.

* * * * *